United States Patent
Tanabe

(10) Patent No.: US 8,455,158 B2
(45) Date of Patent: Jun. 4, 2013

(54) METHOD OF MANUFACTURING A SUBSTRATE FOR A MASK BLANK, METHOD OF MANUFACTURING A MASK BLANK, METHOD OF MANUFACTURING A TRANSFER MASK, AND METHOD OF MANUFACTURING A SEMICONDUCTOR DEVICE

(75) Inventor: Masaru Tanabe, Tokyo (JP)

(73) Assignee: Hoya Corporation, Tokyo (JP)

( * ) Notice: Subject to any disclaimer, the term of this patent is extended or adjusted under 35 U.S.C. 154(b) by 108 days.

(21) Appl. No.: 13/016,645

(22) Filed: Jan. 28, 2011

(65) Prior Publication Data

US 2011/0189595 A1 Aug. 4, 2011

(30) Foreign Application Priority Data

Jan. 29, 2010 (JP) ................ 2010-018283
Dec. 14, 2010 (JP) ................ 2010-277846

(51) Int. Cl.
*G03F 1/22* (2012.01)

(52) U.S. Cl.
USPC ........................................... 430/5

(58) Field of Classification Search
USPC .............. 430/5, 30, 311, 313, 394; 355/53, 355/72, 75, 77
See application file for complete search history.

(56) References Cited

U.S. PATENT DOCUMENTS

| 6,537,844 | B1 | 3/2003 | Itoh |
| 6,883,158 | B1 * | 4/2005 | Sandstrom et al. ............... 430/5 |
| 8,142,963 | B2 * | 3/2012 | Tanabe ............................. 430/5 |
| 2005/0019678 | A1 | 1/2005 | Nakatsu et al. |
| 2006/0194126 | A1 | 8/2006 | Tanabe |

FOREIGN PATENT DOCUMENTS

JP 2006-235321 A 9/2006

* cited by examiner

*Primary Examiner* — Stephen Rosasco
(74) *Attorney, Agent, or Firm* — Sughrue Mion, PLLC

(57) ABSTRACT

In a simulation step, based on information of a main surface shape of a transparent substrate and shape information of a mask stage of an exposure apparatus and using a deflection differential equation taking into account a twist deformation, height information at a plurality of measurement points is obtained by simulating a state where the transparent substrate is set in the exposure apparatus. Based on the height information obtained through the simulation, a flatness of the transparent substrate when it is set in the exposure apparatus is calculated in a flatness calculation step. Then, by judging in a selection step whether or not the calculated flatness satisfies a specification, the transparent substrate whose flatness satisfies the specification is used as a substrate for a mask blank.

40 Claims, 9 Drawing Sheets

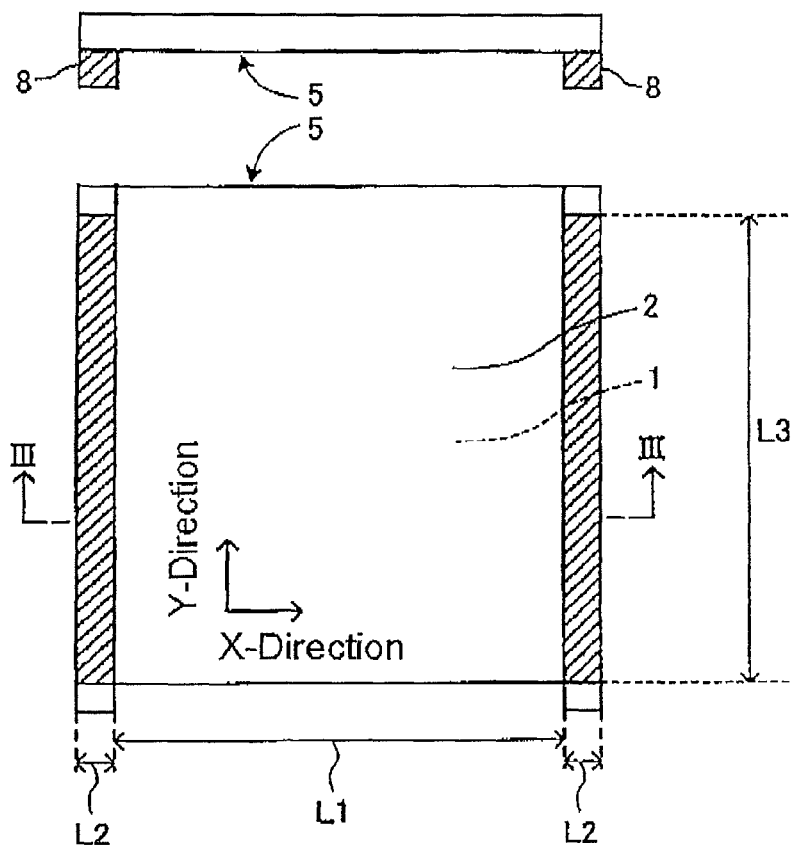

METHOD OF MANUFACTURING A SUBSTRATE FOR A MASK BLANK, METHOD OF MANUFACTURING A MASK BLANK, METHOD OF MANUFACTURING A TRANSFER MASK, AND METHOD OF MANUFACTURING A SEMICONDUCTOR DEVICE

This application is based upon and claims the benefit of priority from Japanese Patent Application No. 2010-018283, filed on Jan. 29, 2010, and Japanese Patent Application No. 2010-277846, filed on Dec. 14, 2010, the disclosures of which are incorporated herein in their entirety by reference.

TECHNICAL FIELD

This invention relates to a method of manufacturing a substrate for a mask blank (hereinafter referred to as a "mask blank substrate"), a method of manufacturing a mask blank, a method of manufacturing a transfer mask, and a method of manufacturing a semiconductor device.

BACKGROUND ART

With the miniaturization of semiconductor devices in recent years, the reduction in wavelength of exposure light for use in photolithography has been proceeding. In the advanced technical field of transmission photolithography, ArF excimer laser light (wavelength: 193 nm) with a wavelength of 200 nm or less is used as exposure light. However, demand for further miniaturization has been increasing and such demand is difficult to satisfy only by using the ArF excimer laser light as the exposure light and thus has been dealt with by increasing NA by the use of the oblique illumination method or the like. With the increase in NA, however, the focal depth of exposure apparatuses has been decreasing. Accordingly, if a transfer mask is deformed to reduce its flatness when the transfer mask is set (chucked) in an exposure apparatus by vacuum suction or the like, the focus position may be shifted in transferring a mask pattern of the transfer mask onto a semiconductor substrate as a transfer target, thus degrading the transfer accuracy.

In view of this, it has been proposed to simulate, using the finite element method, a shape of a transparent substrate for use in a mask blank when the transparent substrate is set in an exposure apparatus, thereby estimating a flatness thereof. However, there has been a problem that although the shape of a main surface of the substrate can be estimated somewhat accurately by the simulation of the substrate shape using the finite element method, the time required for the simulation is very long.

In order to solve this problem, JP-A-2006-235321 (Patent Document 1) discloses a technique in which a flatness of a transparent substrate when it is set in an exposure apparatus is estimated by calculation through simulation in a short time and the transparent substrate with an excellent estimated flatness value is selected as a mask blank transparent substrate, thereby manufacturing a mask blank or an exposure mask (transfer mask) using the selected mask blank transparent substrate.

In the simulation described in Patent Document 1, a surface shape of the transparent substrate is first measured. Subsequently, the following three deformations are estimated. Herein, the direction of gravity is given as a Z-direction.

(1) a deflection of the transparent substrate along an X-direction (perpendicular to the Z-direction) due to gravity (2) a warp of the transparent substrate along the X-direction with respect to a mask stage as fulcrums due to suction from the mask stage when the transparent substrate is set in an exposure apparatus (3) a deformation of the transparent substrate in regions along a Y-direction (perpendicular to the X- and Z-directions) where the transparent substrate contacts the mask stage, due to suction from the mask stage when the transparent substrate is set in the exposure apparatus Then, a simulation is carried out by a deflection differential equation using these estimated values and the surface shape of the transparent substrate measured in advance. From a surface shape, calculated by the simulation, of the transparent substrate when it is set in the exposure apparatus, a flatness thereof is obtained (calculated or found). When this flatness satisfies a specification, a mask blank or an exposure mask is produced from such a transparent substrate.

SUMMARY OF THE INVENTION

The technique disclosed in Patent Document 1 sufficiently improves the above-mentioned problem of the shift of the focus position which occurs in transferring a mask pattern of a transfer mask onto a semiconductor substrate as a transfer target.

However, demand for further miniaturization of semiconductor devices is increasing more and more and, with the introduction of the immersion exposure technique, hyper-NA, i.e. NA>1, has been achieved so that the focal depth of exposure apparatuses is becoming extremely small. Particularly in the case of a transfer mask having a fine transfer pattern of the DRAM hp45 nm or subsequent generation, the influence, which is exerted upon the transfer accuracy, of the displacement of the position of the transfer pattern with respect to a reference plane on a mask stage due to a change in substrate shape before and after the transfer mask is chucked on the mask stage has been increasing. As a consequence, correction of the transfer pattern from its design pattern in consideration of such an influence is becoming necessary.

In order to achieve this, shape estimation of a substrate main surface after chucking on the mask stage should be such that estimation of a change in shape over a predetermined region of the substrate main surface can be carried out with high accuracy, i.e. it is insufficient that only an estimated flatness value (a difference between maximum and minimum values of height information in the predetermined region of the substrate main surface) is highly accurate. Particularly in the case of a transfer mask applied with the double patterning technique, if the estimation accuracy of a substrate shape change before and after chucking is low, the estimation accuracy of the displacement of the position of a transfer pattern with respect to the reference plane on the mask stage due to the substrate shape change is also lowered so that a serious problem arises on the transfer accuracy of the transfer pattern onto a transfer target (a resist film on a semiconductor substrate, or the like).

According to the simulation of Patent Document 1, the time required for the simulation is short and thus the throughput is good while the estimation accuracy of the shape of the substrate main surface after chucking is insufficient for application to a mask blank substrate for use in a transfer mask of the DRAM hp45 nm or subsequent generation or a transfer mask applied with the double patterning technique. On the other hand, according to the simulation of the substrate shape using the finite element method, certain high accuracy can be obtained even when applied to such a transfer mask while the time required for the simulation is very long to cause a serious problem on the throughput. That is, it is becoming necessary that estimation of a main surface shape after a transparent substrate is chucked on a mask stage of an exposure apparatus be carried out with high accuracy in a short simulation time.

In order to solve the above-mentioned problems, with respect to mask blank substrates which were selected by the prior art, the present inventor has made an intensive study on the tendency of those mask blank substrates each having a large difference between a main surface shape, after the mask blank substrate was chucked on a mask stage of an exposure apparatus, obtained through simulation and a main surface shape which was actually measured after the mask blank substrate was actually chucked on the mask stage. As a result, the present inventor has found out that every mask blank substrate with the large difference between the simulation and the actual measurement has a large twist tendency in a main surface shape which was actually measured while the mask blank substrate was in a free-standing state. In view of this, the present inventor has considered to take into account, in a simulation, also a deformation which acts in a direction to correct torsion of a transparent substrate (hereinafter, this deformation will be referred to as a "twist deformation") when the transparent substrate is chucked on the mask stage. The present inventor has also found out that the same tendency is shown when a main surface shape is measured with respect to a mask blank formed with a thin film for pattern formation (hereinafter referred to as a "pattern-formation thin film") and then a main surface shape after the mask blank is chucked on the mask stage is calculated from the measured main surface shape through simulation. As a consequence, the present inventor has considered to take into account, in a simulation, also a deformation which acts in a direction to correct torsion of a mask blank (hereinafter, this deformation will be referred to as a "twist deformation") when the mask blank is chucked on the mask stage.

A method of manufacturing a mask blank substrate according to an aspect of the present invention is characterized by comprising a step of preparing a transparent substrate having a precision-polished main surface, a shape measurement step of measuring a before-chucking main surface shape in a measurement region of the main surface, a simulation step of obtaining, through simulation, an after-chucking main surface shape of a condition where the transparent substrate is chucked on a mask stage of an exposure apparatus, and a selection step of selecting, as a mask blank substrate, the transparent substrate whose flatness in a calculation region is a predetermined value or less, the flatness being obtained from the after-chucking main surface shape, wherein the simulation step comprises calculating a gravity deformation amount which is a deformation amount of the main surface and which is caused by gravity when the transparent substrate is placed on the mask stage, calculating (a) a lever deformation amount which is caused by lever deformation of the main surface with respect to the mask stage as a fulcrum when the transparent substrate is chucked on the mask stage, (b) a warp deformation amount which is caused by deformation of the main surface following a shape of the mask stage when the transparent substrate is chucked on the mask stage, and (c) a twist deformation amount which is caused by deformation of the main surface that corrects torsion thereof when the transparent substrate is chucked on the mask stage, and calculating the after-chucking main surface shape by adding the calculated gravity, lever, warp, and twist deformation amounts to the before-chucking main surface shape.

In the method of manufacturing the mask blank substrate, it is preferable that the shape measurement step comprises a step of correlating information of the before-chucking main surface shape with the measured transparent substrate and storing in a recording apparatus, and the simulation step comprises a step of correlating information of the after-chucking main surface shape with the transparent substrate subjected to the simulation and storing in the recording apparatus.

A method of manufacturing a mask blank substrate according to another aspect of the present invention is characterized by comprising a step of preparing a transparent substrate having a precision-polished main surface, a shape measurement step of measuring a before-chucking main surface shape in a measurement region of the main surface and correlating information of the before-chucking main surface shape with the measured transparent substrate and storing in a recording apparatus, and a simulation step of obtaining, through simulation, an after-chucking main surface shape of a condition where the transparent substrate is chucked on a mask stage of an exposure apparatus, wherein the simulation step comprises calculating a gravity deformation amount which is a deformation amount of the main surface and which is caused by gravity when the transparent substrate is placed on the mask stage, calculating (a) a lever deformation amount which is caused by lever deformation of the main surface with respect to the mask stage as a fulcrum when the transparent substrate is chucked on the mask stage, (b) a warp deformation amount which is caused by deformation of the main surface following a shape of the mask stage when the transparent substrate is chucked on the mask stage, and (c) a twist deformation amount which is caused by deformation of the main surface that corrects torsion thereof when the transparent substrate is chucked on the mask stage, and calculating the after-chucking main surface shape by adding the calculated gravity, lever, warp, and twist deformation amounts to the before-chucking main surface shape, and correlating information of the after-chucking main surface shape with the transparent substrate subjected to the simulation and storing in the recording apparatus.

In each of these methods of manufacturing the mask blank substrates, it is preferable that the measurement region is a region including a region where the transparent substrate is chucked by the mask stage of the exposure apparatus. It is further preferable that the measurement region is a region excluding a peripheral region of more than 0 mm and 3 mm or less from a chamfered surface of the transparent substrate.

In each of these methods of manufacturing the mask blank substrates, it is preferable that the calculation region is a 132 mm square region with respect to a center of the transparent substrate. Furthermore, it is favorable that the predetermined value of the flatness is 0.24 µm.

It is preferable that each of these methods of manufacturing the mask blank substrates comprises a step of selecting the transparent substrate whose flatness in a predetermined region obtained from the before-chucking main surface shape is 0.4 µm or less.

A method of manufacturing a mask blank according to an aspect of the present invention comprises a thin film forming step of forming a pattern-formation thin film on the main surface of the mask blank substrate manufactured by the above-mentioned methods of manufacturing the mask blank substrates.

A method of manufacturing a transfer mask according to an aspect of the present invention comprises a step of forming a transfer pattern in the pattern-formation thin film of the mask blank manufactured by the above-mentioned method of manufacturing the mask blank.

A method of manufacturing a mask blank according to another aspect of the present invention is characterized by comprising a step of preparing a mask blank having a pattern-formation thin film on a main surface of a transparent substrate, a shape measurement step of measuring a before-chucking main surface shape in a measurement region of a main surface of the mask blank, a simulation step of obtaining, through simulation, an after-chucking main surface shape of a condition where the mask blank is chucked on a mask stage of an exposure apparatus, and a selection step of selecting the mask blank whose flatness in a calculation region is a predetermined value or less, the flatness being obtained from the after-chucking main surface shape, wherein the simulation step comprises calculating a gravity deformation amount which is a deformation amount of the main surface and which is caused by gravity when the mask blank is placed on the mask stage, calculating (a) a lever deformation amount which is caused by lever deformation of the main surface with respect to the mask stage as a fulcrum when the mask blank is chucked on the mask stage, (b) a warp deformation amount which is caused by deformation of the main surface following a shape of the mask stage when the mask blank is chucked on the mask stage, and (c) a twist deformation amount which is caused by deformation of the main surface that corrects torsion thereof when the mask blank is chucked on the mask stage, and calculating the after-chucking main surface shape by adding the calculated gravity, lever, warp, and twist deformation amounts to the before-chucking main surface shape.

In the method of manufacturing the mask blank, it is preferable that the shape measurement step comprises a step of correlating information of the before-chucking main surface shape with the measured mask blank and storing in a recording apparatus, and the simulation step comprises a step of correlating information of the after-chucking main surface shape with the mask blank subjected to the simulation and storing in the recording apparatus.

A method of manufacturing a mask blank according to a further aspect of the present invention is characterized by comprising a step of preparing a mask blank having a pattern-formation thin film on a main surface of a transparent substrate, a shape measurement step of measuring a before-chucking main surface shape in a measurement region of a main surface of the mask blank and correlating information of the before-chucking main surface shape with the measured mask blank and storing in a recording apparatus, and a simulation step of obtaining, through simulation, an after-chucking main surface shape of a condition where the mask blank is chucked on a mask stage of an exposure apparatus, wherein the simulation step comprises calculating a gravity deformation amount which is a deformation amount of the main surface and which is caused by gravity when the mask blank is placed on the mask stage, calculating (a) a lever deformation amount which is caused by lever deformation of the main surface with respect to the mask stage as a fulcrum when the mask blank is chucked on the mask stage, (b) a warp deformation amount which is caused by deformation of the main surface following a shape of the mask stage when the mask blank is chucked on the mask stage, and (c) a twist deformation amount which is caused by deformation of the main surface that corrects torsion thereof when the mask blank is chucked on the mask stage, and calculating the after-chucking main surface shape by adding the calculated gravity, lever, warp, and twist deformation amounts to the before-chucking main surface shape, and correlating information of the after-chucking main surface shape with the mask blank subjected to the simulation and storing in the recording apparatus.

In each of these methods of manufacturing the mask blanks, it is preferable that the measurement region is a region including a region where the mask blank is chucked by the mask stage of the exposure apparatus. It is preferable that the measurement region is a region excluding a peripheral region of more than 0 mm and 3 mm or less from a chamfered surface of the transparent substrate.

In each of these methods of manufacturing the mask blanks, it is preferable that the calculation region is a 132 mm square region with respect to a center of the mask blank. It is favorable that the predetermined value of the flatness is 0.24 µm.

It is preferable that each of these methods of manufacturing the mask blanks further comprises a step of selecting the mask blank whose flatness in a predetermined region obtained from the before-chucking main surface shape is 0.4 µm or less.

A method of manufacturing a transfer mask according to another aspect of the present invention comprises a step of forming a transfer pattern in the pattern-formation thin film of the mask blank manufactured by the method of manufacturing the above-mentioned mask blank.

A method of manufacturing a transfer mask according to a further aspect of the present invention is characterized by comprising a step of preparing a mask blank having a pattern-formation thin film on a main surface of a transparent substrate, a shape measurement step of measuring a before-chucking main surface shape in a measurement region of a main surface of the mask blank, a simulation step of obtaining, through simulation, an after-chucking main surface shape of a condition where the mask blank is chucked on a mask stage of an exposure apparatus, a selection step of selecting the mask blank whose flatness in a calculation region is a predetermined value or less, the flatness being obtained from the after-chucking main surface shape, and a step of forming a transfer pattern in the pattern-formation thin film of the mask blank selected in the selection step, wherein the simulation step comprises calculating a gravity deformation amount which is a deformation amount of the main surface and which is caused by gravity when the mask blank is placed on the mask stage, calculating (a) a lever deformation amount which is caused by lever deformation of the main surface with respect to the mask stage as a fulcrum when the mask blank is chucked on the mask stage, (b) a warp deformation amount which is caused by deformation of the main surface following a shape of the mask stage when the mask blank is chucked on the mask stage, and (c) a twist deformation amount which is caused by deformation of the main surface that corrects torsion thereof when the mask blank is chucked on the mask stage, and calculating the after-chucking main surface shape by adding the calculated gravity, lever, warp, and twist deformation amounts to the before-chucking main surface shape.

In the method of manufacturing the transfer mask, it is preferable that the shape measurement step comprises a step of correlating information of the before-chucking main surface shape with the measured mask blank and storing in a recording apparatus, and the simulation step comprises a step of correlating information of the after-chucking main surface shape with the mask blank subjected to the simulation and storing in the recording apparatus.

In the method of manufacturing the transfer mask, it is preferable that the measurement region is a region including a region where the mask blank is chucked by the mask stage of the exposure apparatus. It is preferable that the measurement region is a region excluding a peripheral region of more than 0 mm and 3 mm or less from a chamfered surface of the transparent substrate.

In the method of manufacturing the transfer mask, it is preferable that the calculation region is a 132 mm square region with respect to a center of the mask blank. It is favorable that the predetermined value of the flatness is 0.24 μm.

It is preferable that the method of manufacturing the transfer mask further comprises a step of selecting the mask blank whose flatness in a predetermined region obtained from the before-chucking main surface shape is 0.4 μm or less.

A method of manufacturing a semiconductor device according to an aspect of the present invention forms a circuit pattern on a semiconductor wafer by using the transfer mask manufactured by the method of manufacturing the above-mentioned transfer mask By taking into account, in a simulation, a twist deformation being a deformation which acts in a direction to correct torsion of a transparent substrate when the transparent substrate is chucked in an exposure apparatus, it is possible to more accurately estimate a main surface shape of the transparent substrate when it is chucked in the exposure apparatus. As a consequence, it is possible to select a transparent substrate which is suitable as a mask blank substrate for a transfer mask for use in an exposure apparatus using the immersion exposure technique. Since the main surface shape after chucking can be accurately estimated, it is possible to accurately estimate displacement of a transfer pattern with respect to a reference plane before and after the transfer mask is chucked, and thus to correct a design pattern in consideration of such displacement of the transfer pattern to thereby produce the transfer mask.

Further, by taking into account, in a simulation, a twist deformation being a deformation which acts in a direction to correct torsion of a mask blank when the mask blank is chucked in an exposure apparatus, it is possible to more accurately estimate a main surface shape of the mask blank when it is chucked in the exposure apparatus. As a consequence, it is possible to select a mask blank which is suitable for a transfer mask for use in an exposure apparatus using the immersion exposure technique. Since the main surface shape after chucking can be accurately estimated, it is possible to accurately estimate displacement of a transfer pattern with respect to a reference plane before and after the transfer mask is chucked, and thus to correct a design pattern in consideration of such displacement of the transfer pattern to thereby produce the transfer mask.

Further, using the transfer mask produced in consideration of the accurately estimated main surface shape after chucking, it is possible to expose and transfer the transfer pattern onto a resist film on a semiconductor wafer, or the like. As a consequence, it is possible to form a highly accurate circuit pattern on the semiconductor wafer or the like.

BRIEF DESCRIPTION OF THE DRAWINGS

FIGS. 3A to 3C are diagrams showing the transparent substrate set on a mask stage of an exposure apparatus;

DESCRIPTION OF THE EMBODIMENTS

Hereinbelow, a first embodiment of this invention will be described with reference to the drawings.

Figure 1:
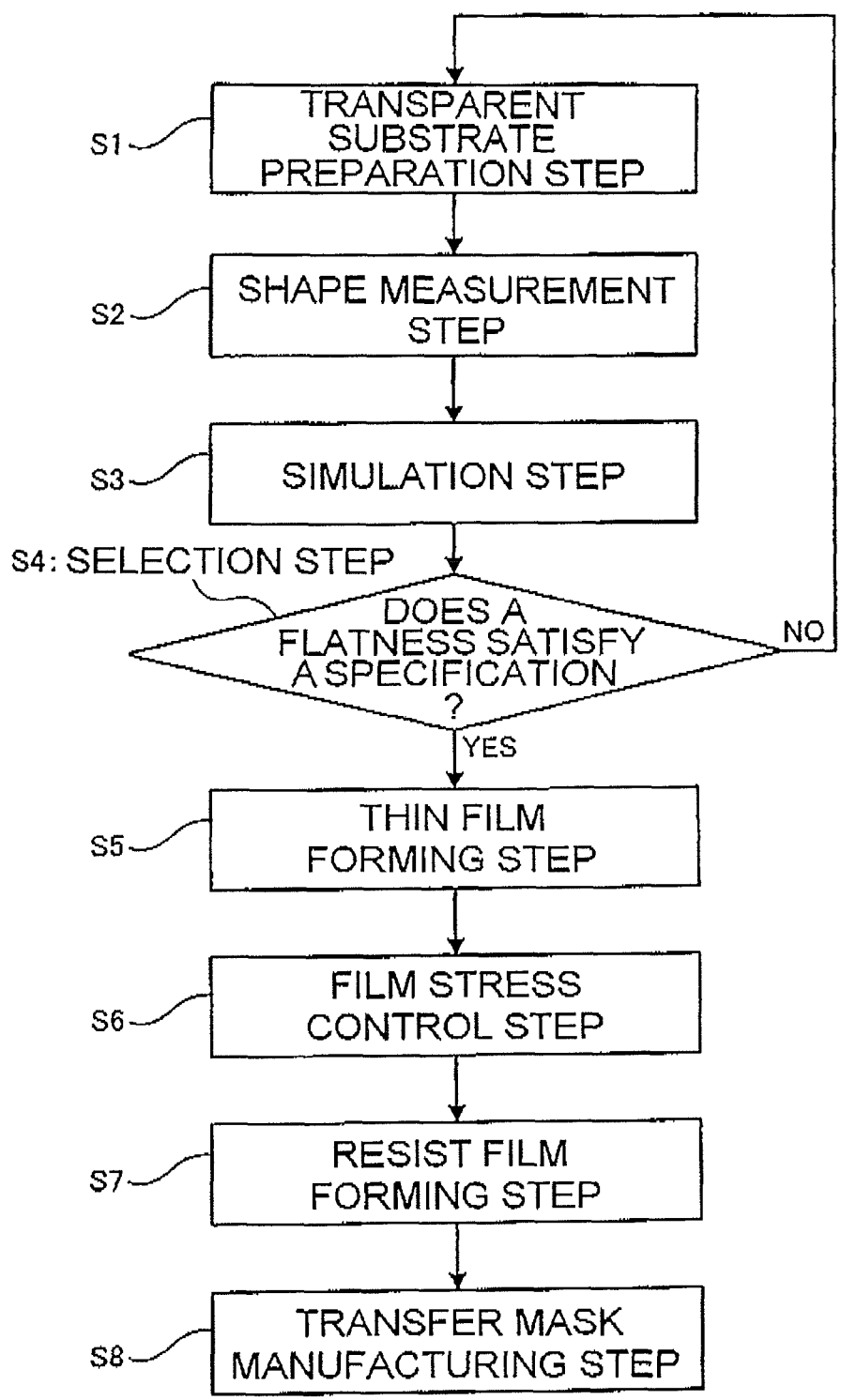
FIG. 1 is a flowchart showing a transfer mask manufacturing method including a mask blank substrate manufacturing method according to a first embodiment of this invention.

FIG. 1 is a flowchart showing a transfer mask manufacturing method including a mask blank substrate manufacturing method according to the first embodiment of this invention.

The mask blank substrate manufacturing method comprises a transparent substrate (synthetic quartz glass substrate) preparation step (S1), a shape measurement step (S2), a simulation step (S3), and a selection step (S4) in FIG. 1. Then, a pattern-formation thin film is formed on a main surface of a manufactured mask blank substrate by a thin film forming step (S5), thereby manufacturing a mask blank. Then, using the manufactured mask blank, a transfer mask is manufactured by a resist film forming step (S7) and a transfer mask manufacturing step (S8). When a film stress that contributes to deformation of the mask blank substrate is present in the pattern-formation thin film formed on the mask blank substrate, a film stress control step (S6) may be provided for the purpose of reducing the film stress. The resist film forming step (S7) may be included in the mask blank manufacturing steps.

Hereinbelow, the above-mentioned respective steps will be described in sequence. Herein, a synthetic quartz glass is used as a transparent substrate. However, the material of the transparent substrate is not particularly limited as long as it can be used as a substrate of a transfer mask, and use can be made of, for example, a soda-lime glass, an aluminosilicate glass, a borosilicate glass, an alkali-free glass, or a calcium fluoride glass. In the following description, the transparent substrate has a size of about 152 mm×about 152 mm×6.35 mm, which, however, is not particularly limited. Also in the case of a transparent substrate which is larger or smaller than the size of about 152 mm×about 152 mm×6.35 mm, the same effect can be obtained. With respect to a flatness calculated from a main surface shape of the transparent substrate after chucking, a region for calculating such a flatness can be properly set according to the size of the transparent substrate.

(A) Transparent Substrate Preparation Step (S1)

Figure 2A:
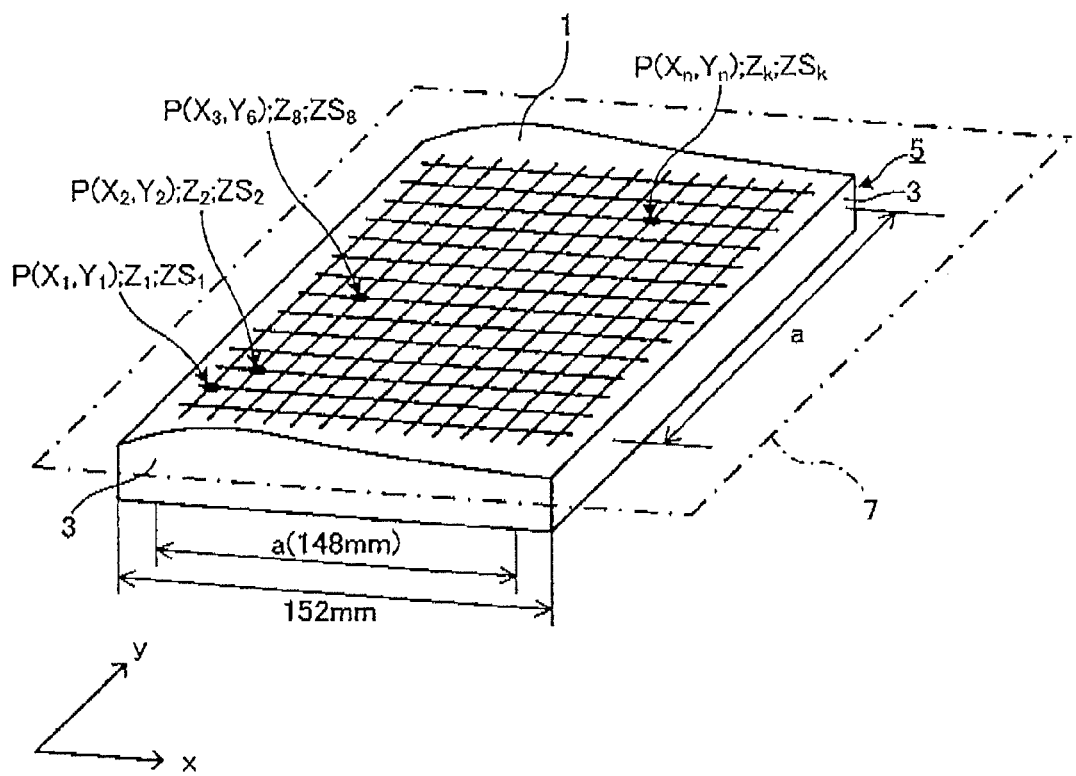
FIG. 2A is a perspective view of a transparent substrate for explaining measurement points in obtaining a main surface shape before chucking and in calculating a main surface shape after chucking through simulation.
Figure 2B:
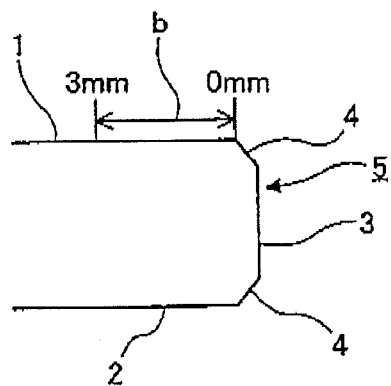
FIG. 2B is a cross-sectional view of an outer peripheral portion of the transparent substrate shown in FIG. 2A.

FIG. 2A is a perspective view of a transparent substrate and FIG. 2B is a cross-sectional view of an outer peripheral portion of the transparent substrate. First, a synthetic quartz glass plate is obtained by cutting a synthetic quartz glass ingot, produced by a generally known method, into a size of about 152.4 mm×about 152.4 mm×about 6.8 mm. Subsequently, grinding and chamfering are applied to the obtained synthetic quartz glass plate, then, main surfaces 1 and 2, end faces 3, and chamfered surfaces 4 being the surfaces of the synthetic quartz glass plate are mirror-polished, and further, the main surfaces 1 and 2 are precision-polished. In this manner, a transparent substrate (synthetic quartz glass substrate) 5 having a size of about 152 mm×about 152 mm×6.35 mm is prepared.

A pattern-formation thin film (light-shielding film, light-semitransmissive film, or the like) is formed on the main surface 1 in the thin film forming step (S5). In the transparent substrate preparation step (S1), the surface roughness of the main surfaces 1 and 2 of the transparent substrate 5 is set to about 0.2 nm or less by root mean square roughness (Rq) while the surface roughness of the end faces 3 and the chamfered surfaces 4 is set to about 0.03 μm or less by arithmetic mean roughness (Ra).

(B) Shape Measurement Step (S2)

As means for obtaining a before-chucking main surface shape which is a main surface shape of the main surface 1 of the transparent substrate 5 before it is placed on a mask stage of an exposure apparatus, use can be made of, for example, a flatness measuring apparatus (not illustrated) utilizing a known optical interferometer. In order to suppress as much as possible deflection of the transparent substrate 5 due to its self-weight, the apparatus is preferably of the type that can measure the flatness while the transparent substrate 5 is stood upright or substantially upright (free-standing state). Herein, the before-chucking main surface shape represents, as shown in FIG. 2A, height information $Zk$ (k is an integer) from a reference plane 7 (a focal plane calculated by the method of least squares) at a plurality of measurement points P (Xm, Yn) (m and n are integers) in an actual measurement region (a×a) provided on the main surface 1 of the transparent substrate 5. It is preferable that the height information $Zk$ be measured as accurately as possible and, particularly, be measured in the order of nanometers. In FIG. 2A, a grid on the main surface 1 of the transparent substrate 5 is virtual lines for showing the plurality of measurement points P (Xm, Yn) and thus is not lines actually present on the main surface 1.

The above-mentioned actual measurement region (a×a) for measuring the before-chucking main surface shape is properly selected according to a size of the transparent substrate 5, a measurement accuracy of the flatness measuring apparatus, a region where the mask stage of the exposure apparatus contacts the main surface 1 of the transparent substrate 5, and so on. It is preferable to obtain the before-chucking main surface shape over the entire region of the main surface 1 of the transparent substrate 5 in order to carry out a later-described simulation with high accuracy. However, it is set to include at least the region where the mask stage of the exposure apparatus contacts the main surface 1 of the transparent substrate 5 (i.e. the region where the transparent substrate 5 is chucked by the mask stage of the exposure apparatus).

In the case of the flatness measuring apparatus utilizing the existing optical interferometer, it is difficult to accurately measure the height information $Zk$ at the outer peripheral portion of the transparent substrate 5, i.e. near the boundary between the main surface 1 and each chamfered surface 4 as shown in FIG. 2B. In consideration of these points, the actual measurement region (a×a) of the main surface 1 for obtaining the before-chucking main surface shape is preferably set to a region obtained by excluding, from the entire region of the main surface 1, a peripheral region b of more than 0 mm and 3 mm or less from each chamfered surface 4 of the transparent substrate 5. Particularly, the actual measurement region (a×a) for obtaining the before-chucking main surface shape is preferably set to a region obtained by excluding, from the entire region of the main surface 1, a peripheral region b of no less than 0.5 mm and 2.5 mm or less from each chamfered surface 4 of the transparent substrate 5 and is more preferably set to a region obtained by excluding, from the entire region of the main surface 1, a peripheral region b of no less than 1 mm and 2 mm or less from each chamfered surface 4 of the transparent substrate 5. For example, in the case of the transparent substrate 5 having a size of 152 mm×152 mm, the actual measurement region (a×a) for obtaining the before-chucking main surface shape is preferably set to a size of 146 mm×146 mm and more preferably a size of 148 mm×148 mm.

Further, in order to carry out the later-described simulation with high accuracy, it is preferable that the measurement points P (Xm, Yn) for obtaining the height information $Zk$ be set as many as possible. However, although more accurate simulation results can be achieved by increasing the number of the measurement points P (Xm, Yn), the simulation requires a lot of time. Therefore, it is preferable to determine the measurement points P (Xm, Yn) taking these points into account. For example, the measurement points P (Xm, Yn) can be set to 256×256 points.

It is preferable that the information of the before-chucking main surface shape thus obtained (respective measurement points P and various information about the substrate main surface such as height information $Zk$ at those measurement points A) be related to or correlated with the measured transparent substrate and recorded in a recording apparatus (PC, network server, IC tag, or the like). This recorded information of the before-chucking main surface shape will be used in the later transfer mask manufacturing step (S8). For the correlation between the information of the before-chucking main surface shape and the transparent substrate, a method described in International Publication No. WO2005/085951 may be used. Alternatively, a marker in the form a plurality of pits may be provided by irradiating laser light onto a surface of a transparent substrate at a portion (an end face, a chamfered surface, a notch mark portion, a peripheral region around a transfer pattern forming region of a main surface, or the like) which is free of the influence of exposure by an exposure apparatus as described in JP-A-2006-309143, and information of a before-chucking main surface shape of the transparent substrate may be correlated with the marker and recorded in the recording apparatus. A marker, for use in correlation, of a transparent substrate is not limited to the marker on the surface of the transparent substrate, but may be formed by irradiating laser light from a plurality of laser light sources so as to be focused on the inside of the transparent substrate to thereby locally modify it.

(C) Simulation Step (S3)

In this simulation step, by simulating a state where the transparent substrate 5 is set on the mask stage of the exposure apparatus, height information $ZSk$ (k is an integer) from the reference plane 7 (FIG. 2A) is obtained at the plurality of measurement points P (Xm, Yn) on the main surface 1 of the transparent substrate 5.

FIGS. 3A to 3C are diagrams showing the state where the transparent substrate 5 is set on a mask stage 8 of an exposure apparatus (not illustrated). FIG. 3B is a diagram seen from above and FIG. 3A is a cross-sectional view taken along line of FIG. 3B. As shown in FIG. 3B, the mask stage 8 comprises two vacuum chuck portions disposed parallel to each other on an X-Y plane which is substantially perpendicular to the direction of gravity. These two vacuum chuck portions are spaced apart from each other by a distance L1 in an X-direction and each extend in a Y-direction (perpendicular to the X-direction). Each vacuum chuck portion has a width L2 in the X-direction and a length L3 in the Y-direction.

FIG. 3C is a detailed cross-sectional view taken along line of FIG. 3B, wherein the transparent substrate 5 in solid line shows a state before vacuum chucking on the mask stage 8, while, the transparent substrate 5 in broken line shows a state after vacuum chucking on the mask stage 8. Each of the vacuum chuck portions forming the mask stage 8 may have a structure in which two suction ports 10 are formed between three support portions 9 each linearly extending parallel to the main surface 1 of the transparent substrate 5. The transparent substrate 5 is bent or deflected downward due to gravity as shown in solid line when it is only placed on the mask stage 8. On the other hand, when the transparent substrate 5 is chucked on the mask stage 8 by vacuum suction, it is deformed to contact the mask stage 8 as shown in broken line.

The conditions necessary for obtaining, through simulation, the height information ZSk (FIG. 2A) at the plurality of measurement points P (Xm, Yn) on the transparent substrate 5 when it is set in the exposure apparatus are the height information Zk from the reference plane 7 at the plurality of measurement points P (Xm, Yn) on the main surface 1 of the transparent substrate 5, which is obtained in the shape measurement step (S2), and shape information of the mask stage 8 of the exposure apparatus including regions where the mask stage 8 contacts the main surface 1 of the transparent substrate 5 (i.e. regions each having the X-direction width L2 and the Y-direction length L3 in the mask stage 8). The shape information of the mask stage 8 includes the X-direction width L2, the Y-direction length L3, and the X-direction distance L1 between those regions each having the X-direction width L2 and the Y-direction length L3. According to a deflection differential equation in mechanics of materials by the use of these information, it is possible to obtain, through simulation, the height information ZSk from the reference plane 7 at the plurality of measurement points P (Xm, Yn) on the main surface 1 of the transparent substrate 5 when it is set on the mask stage 8 of the exposure apparatus.

The deflection differential equation is obtained in the following manner, wherein a positive direction of Z-axis is defined as the direction of gravity, > (height information ZSk on the main surface of the transparent substrate when it is vacuum-chucked on the mask stage)=(height information Zk on the main surface of the transparent substrate obtained in the shape measurement step (S2))+(an estimated value of deformation due to deflection of the transparent substrate along the X-direction due to gravity)[gravity deformation amount]+(an estimated value of warp of the transparent substrate along the X-direction with respect to the mask stage as fulcrums due to vacuum chucking (lever effect)) [lever deformation amount]+(an estimated value of deformation of the transparent substrate due to vacuum chucking in regions along the Y-direction (longitudinal direction of the mask stage) where the transparent substrate contacts the mask stage) [warp deformation amount]+(an estimated value of deformation (twist deformation) which acts in a direction to correct torsion of the transparent substrate when the transparent substrate is set on the mask stage) [twist deformation amount]

Herein, the X- and Y-directions are identified in FIG. 3B. The X-direction is a direction perpendicular to the longitudinal direction of the mask stage 8 while the Y-direction is a direction along the longitudinal direction of the mask stage 8. Further, "regions along the Y-direction where the transparent substrate contacts the mask stage" are obtained from the regions, as the shape information of the mask stage 8, where the mask stage 8 contacts the main surface 1 of the transparent substrate 5.

In the above-mentioned simulation step (S3), the simulation is carried out by paying attention to the fact that the transparent substrate normally has the twist component and thus taking into account also the deformation (twist deformation) which acts in the direction to correct the torsion of the transparent substrate when the transparent substrate is set (vacuum-chucked) on the mask stage. Therefore, it is possible to obtain much more accurate simulation results than conventional.

The above-mentioned shape information of the mask stage 8 may include, in addition to the regions where the mask stage 8 contacts the main surface 1 of the transparent substrate 5 (i.e. the regions each having the X-direction width L2 and the Y-direction length L3), information about the flatness of the mask stage 8 in the above-mentioned regions (surfaces) where the mask stage 8 contacts the main surface 1 of the transparent substrate 5.

It is preferable that the information of the after-chucking main surface shape thus obtained (various information about the substrate main surface after chucking such as height information ZSk at the measurement points A obtained through simulation, information about the mask stage 8, etc.) be correlated with the transparent substrate subjected to the simulation, and recorded in the recording apparatus (PC, network server, IC tag, or the like) in the same manner as recording the information of the before-chucking main surface shape.

(D) Selection Step (S4)

Figure 4:
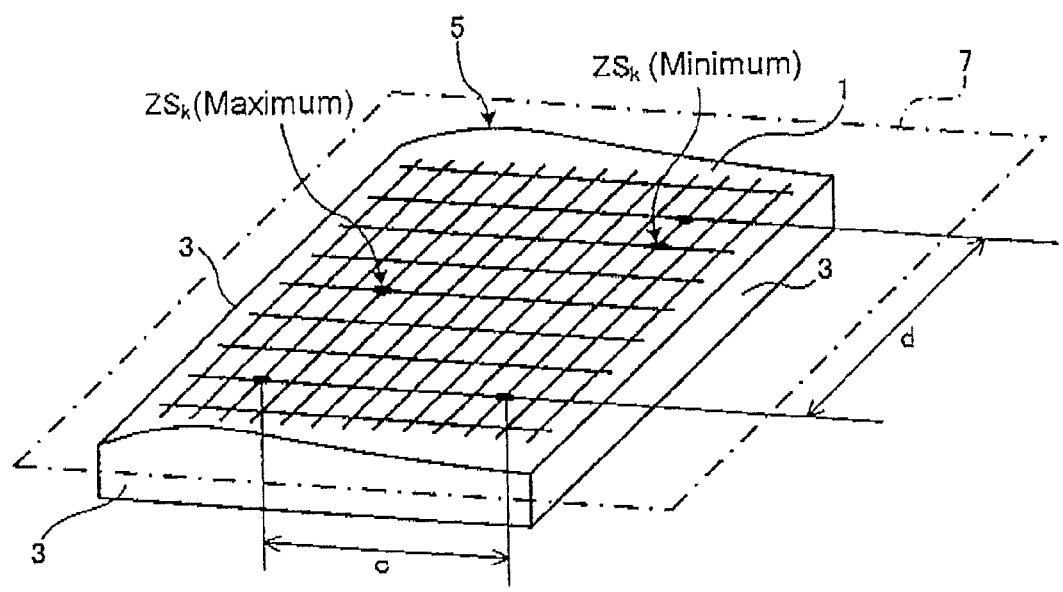
FIG. 4 is a perspective view of the transparent substrate for explaining measurement points in calculating a flatness.

FIG. 4 is a diagram for explaining a process of calculating a flatness from the information of the after-chucking main surface shape obtained in the simulation step (S3) and is a perspective view of the transparent substrate 5. In the selection step (S4), as shown in FIG. 4, a maximum value and a minimum value are obtained in a calculation region (c×d) including a transfer region of a transfer mask (not illustrated) from the height information ZSk, from the reference plane 7, of the main surface 1 obtained in the simulation step (S3) and then, a flatness on the main surface 1 of the transparent substrate 5 when it is set in the exposure apparatus is calculated from a difference between the obtained maximum and minimum values. This flatness contributes to the formation of an excellent transfer pattern at the time of pattern transfer using the exposure apparatus. The calculation region (c×d) including the transfer region of the transfer mask is determined based on an exposure wavelength, the kind of a fine pattern (circuit pattern) to be formed on a semiconductor substrate, and so on. For example, in the case of a mask blank having a size of 152 mm×152 mm, the calculation region (c×d) including the transfer region of the transfer mask can be set to a rectangular shape of 104 mm×132 mm with respect to the center of the substrate main surface or to a square shape of 132 mm×132 mm in consideration of disposing a transfer pattern in a state rotated by 90 degrees. Further, it is more preferable to ensure the flatness also in a peripheral region around the square shape of 132 mm×132 mm and thus to set the calculation region to, for example, a square shape of 142 mm×142 mm.

It is preferable that the flatness of the after-chucking main surface shape thus obtained be also correlated with the transparent substrate and recorded in the recording apparatus (PC, network server, IC tag, or the like) in the same manner as recording the information of the before-chucking main surface shape. The information of the after-chucking main surface shape may be recorded in the recording apparatus simultaneously with the flatness at this stage rather than being recorded in the simulation step (S3).

The flatness of the main surface 1 after chucking calculated by the above-mentioned process is compared with a predetermined specification (a predetermined flatness value or the like) to thereby judge whether or not it satisfies the specification. The transparent substrate 5 judged to satisfy the specification is specified as a mask blank substrate 5A. Only this mask blank substrate 5A is subjected to the thin film forming step (S5) in which a pattern-formation thin film is formed on the mask blank substrate 5A. In this manner, a mask blank is produced. With respect to the transparent substrate 5 judged not to satisfy the specification, the main surface 1 thereof is polished again to prepare a transparent substrate so that its flatness through simulation satisfies the specification. The above-mentioned steps from (A) Transparent Substrate Preparation Step to (D) Selection Step form the mask blank substrate manufacturing method.

The above-mentioned specification is determined by calculating a flatness allowable for a mask blank (or a transfer mask) depending on an exposure wavelength, a substrate chuck structure of a mask stage of an exposure apparatus, and so on. For example, when an exposure light source is an ArF excimer laser (exposure wavelength: 193 nm) and a substrate chuck structure (a support portion structure for the transparent substrate 5) is of the type where, as shown in FIG. 3C, the two suction ports 10 are formed between the three support portions 9 each linearly extending parallel to the main surface 1 of the transparent substrate 5 and the transparent substrate 5 is supported by vacuum chucking on the support portions 9, the above-mentioned specification is determined such that the flatness is 0.24 µm or less in a calculation region (104 mm×132 mm) including a transfer region of a transfer mask. In the case of a transfer mask applied with the double patterning technique, the flatness is preferably set to 0.12 µm or less in the same calculation region as described above.

(E) Thin Film Forming Step (S5)

Figure 5A:
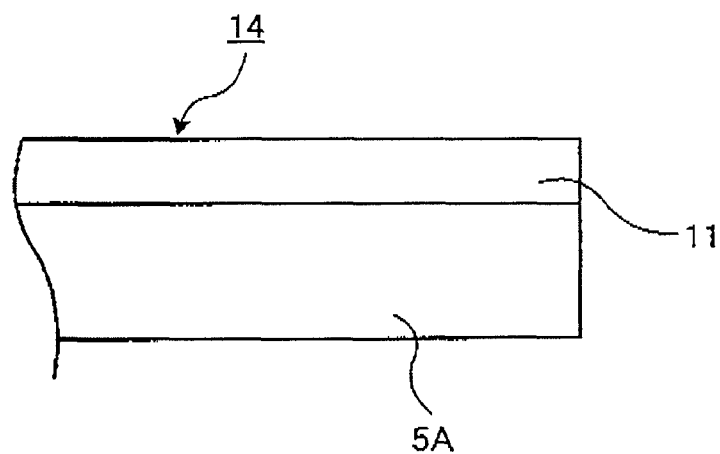
FIGS. 5A and 5B are cross-sectional views showing the structures of mask blanks.

After, in the above-mentioned selection step (S4), the flatness of the transparent substrate 5 is judged to satisfy the specification in the state where the transparent substrate 5 is set on the mask stage 8 of the exposure apparatus, a pattern-formation thin film 11, i.e. a thin film 11 for forming a mask pattern, is formed on the main surface 1 of the transparent substrate 5 (i.e. the mask blank substrate 5A) by sputtering, thereby producing a mask blank 14 as shown in FIG. 5A. The pattern-formation thin film 11 is formed using, for example, a DC magnetron sputtering apparatus. FIG. 5A shows a part of a cross-section of the mask blank 14. The mask blank 14 has the pattern-formation thin film 11 on the mask blank substrate 5A.

The pattern-formation thin film may be, for example, a light-shielding film, a halftone phase shift film, a light-semitransmissive film for use in an enhancer mask or the like, or an etching mask film which is provided on such a film or used for producing a chromeless phase shift mask. As a material of the light-shielding film, use can be made of, for example, chromium, a material composed of a transition metal and silicon (transition metal silicide), or tantalum. The light-shielding film may be a single layer or may have a two-layer laminated structure comprising a light-shielding layer and a front-surface antireflection layer from the substrate side, a three-layer laminated structure comprising a back-surface antireflection layer, a light-shielding layer, and a front-surface antireflection layer from the substrate side, or the like. As a material of the front-surface antireflection layer and the back-surface antireflection layer, it is preferable to use a material obtained by adding oxygen and/or nitrogen to a material of the light-shielding layer. As the transition metal in the transition metal silicide, use can be made of, for example, Mo, W, Ta, Ti, Hf, Zr, Pd, Nb, Ru, Ni, V, Rh, or Cr. As a material of the phase shift film or the light-semitransmissive film, it is preferable to use CrO, CrON, CrOCN, or the like in the case of a chromium-based material, MSiON (M: transition metal; the same shall apply hereinafter), MSiO, MSiN, MSiOC, MSiOCN, or the like in the case of a transition metal silicide-based material, or TaN, TaO, TaON, TaBO, TaBON, or the like in the case of a tantalum-based material.

The pattern-formation thin film can be formed by sputtering. As a sputtering apparatus, use can be made of, for example, a DC magnetron sputtering apparatus, an RF magnetron sputtering apparatus, or an ion-beam sputtering apparatus. When sputtering the light-shielding film on the mask blank substrate, it is preferable to rotate the substrate and to dispose a sputtering target at a position inclined by a predetermined angle with respect to a rotational axis of the substrate, thereby forming the light-shielding film. By such a film forming method, it is possible to minimize in-plane variation of the light-shielding film and thus to uniformly form the light-shielding film. Particularly in the case of the phase shift film or the light-semitransmissive film, when forming the film by rotating the substrate and disposing a sputtering target at a position inclined by a predetermined angle with respect to a rotational axis of the substrate, the in-plane distributions of the phase angle and the transmittance also change by the positional relationship between the substrate and the sputtering target. Accordingly, it is preferable to use a film forming method as described in JP-A-2003-280174.

(F) Film Stress Control Step (S6)

Figure 5B:
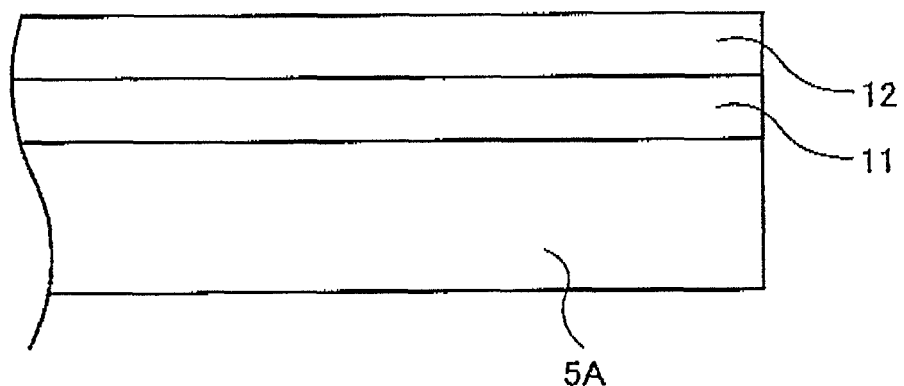

This film stress control step is, for example, such that a heat treatment is applied to the mask blank at a temperature of 150° C. or more at the time of and/or after forming the pattern-formation thin film or that as shown in FIG. 5B, a pattern-formation thin film is formed on the mask blank substrate 5A by laminating a plurality of layers, i.e. a thin film 11 having a compressive stress and a thin film 12 having a tensile stress, to thereby cancel the film stresses of the thin films 11 and 12. A description will be given of the former case (heat treatment) in an Example which will be shown later.

(G) Resist Film Forming Step (S7)

Thereafter, a resist is coated on a surface of the pattern-formation thin film 11 in the mask blank 14 and then a heat treatment is carried out to form a resist film. The resist is preferably a resist for electron beam writing exposure which is capable of forming a fine pattern, and is particularly preferably a chemically amplified resist. The above-mentioned steps from (A) Transparent Substrate Preparation Step to (E) Thin Film Forming Step ((F) Film Stress Control Step if necessary) or to (G) Resist Film Forming Step form a mask blank manufacturing method.

(H) Transfer Mask Manufacturing Step (S8)

The resist film on the mask blank 14 is subjected to writing of a predetermined pattern and then developed to thereby form a resist pattern. Subsequently, using this resist pattern as a mask, the pattern-formation thin film 11 is etched to thereby form a transfer pattern (mask pattern). Finally, the resist pattern is removed, thereby obtaining a transfer mask (exposure mask) in which the transfer pattern is formed on the mask blank substrate 5A.

(I) Semiconductor Device Manufacturing Step

The obtained transfer mask is set (chucked) on the mask stage of the exposure apparatus. Using this transfer mask and according to photolithography using ArF excimer laser light as exposure light, the transfer pattern of the transfer mask is transferred onto a resist film formed on a semiconductor substrate so as to form a required circuit pattern on the semiconductor substrate. In this manner, a semiconductor device is manufactured.

According to the above-mentioned mask blank substrate manufacturing method, all transparent substrates 5 subjected to measurement of a before-chucking main surface shape in (B) Shape Measurement Step are subjected to calculation of an after-chucking main surface shape in (C) Simulation Step. According to this manufacturing method, if a main surface flatness calculated from the after-chucking main surface shape falls within the range of the specification, even the transparent substrate whose main surface flatness calculated from the before-chucking main surface shape is not good is selected as a mask blank substrate. According to this manufacturing method, it is possible to obtain a significant effect that the manufacturing yield is largely improved. However, the transparent substrate whose main surface flatness before chucking is not good while whose main surface flatness after chucking is good within the range of the specification has a property that its main surface shape largely changes before and after chucking. In the case of a transfer mask manufactured using the transparent substrate whose main surface shape largely changes, the displacement amount on the X-Y plane of a transfer pattern formed by a pattern-formation thin film becomes relatively large before and after chucking. In the case of a mask blank substrate for use in a transfer mask having a finer pattern than the DRAM hp45 nm generation, to which the immersion exposure technique is applied, if the displacement amount (position shift) of a transfer pattern before and after chucking is large, the transfer accuracy is largely affected, which is not preferable. Particularly in the case of a mask blank substrate for use in a transfer mask applied with the double patterning technique, the position accuracy of a transfer pattern is strict and thus a serious problem arises if the displacement amount (position shift) of the transfer pattern is large.

In the case where the position shift of the transfer pattern is strictly forbidden as described above, it is preferable that, after measuring a before-chucking main surface shape in (B) Shape Measurement Step, a flatness be calculated in a predetermined region of the before-chucking main surface shape and only a transparent substrate whose calculated flatness is a predetermined value or less be selected and supplied to (C) Simulation Step as the subsequent step. The predetermined region for calculating the flatness of the before-chucking main surface shape may be set the same as the calculation region for calculating the flatness of the after-chucking main surface shape, but it is preferable to ensure a larger region. In the case of a transparent substrate having a size of 152 mm×152 mm, it is preferable to ensure the flatness in a square region of 132 mm×132 mm with respect to the center of a substrate main surface and it is more preferable to ensure the flatness in a square region of 142 mm×142 mm. The predetermined value of the flatness is preferably set to 0.4 μm or less in the case of a mask blank substrate for use in a transfer mask having a finer pattern than the DRAM hp45 nm generation, to which the immersion exposure technique is applied, while, it is preferably set to 0.3 μm or less in the case of a mask blank substrate for use in a transfer mask applied with the double patterning technique.

Next, a second embodiment of this invention will be described with reference to the drawings.

Figure 6:
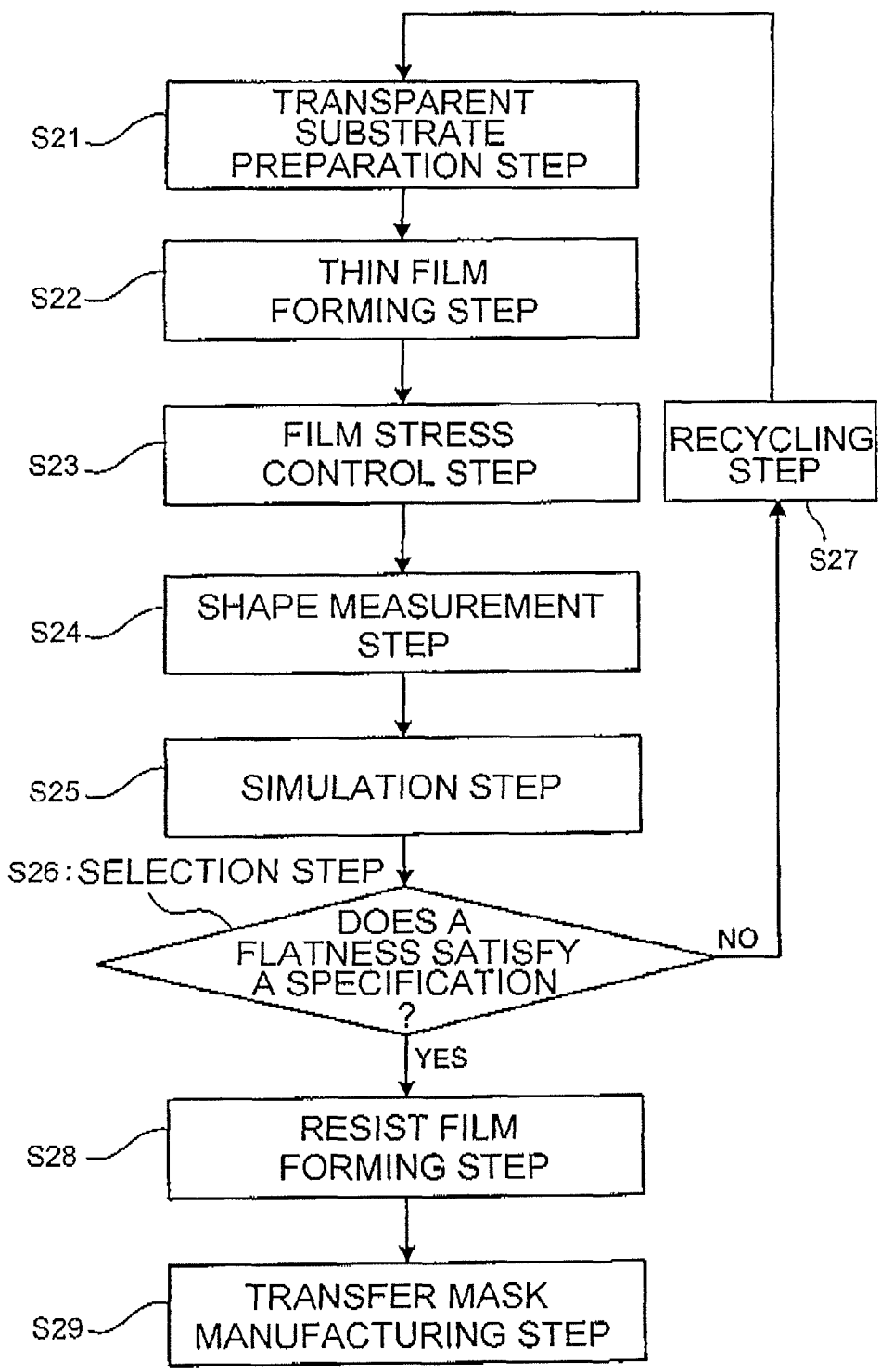
FIG. 6 is a flowchart showing a transfer mask manufacturing method including a mask blank manufacturing method according to a second embodiment of this invention.

FIG. 6 is a flowchart showing a transfer mask manufacturing method including a mask blank manufacturing method according to the second embodiment of this invention.

The mask blank manufacturing method comprises a transparent substrate preparation step (S21), a thin film forming step (S22), a shape measurement step (S24), a simulation step (S25), and a selection step (S26). Then, using a manufactured mask blank, a transfer mask is manufactured by a resist film forming step (S28) and a transfer mask manufacturing step (S29). When a film stress that contributes to deformation of a transparent substrate is present in a pattern-formation thin film formed on the transparent substrate, a film stress control step (S23) may be provided for the purpose of reducing the film stress. The resist film forming step (S28) may be included in the mask blank manufacturing steps. With respect to the above-mentioned respective steps, portions different from the above-mentioned flowchart of FIG. 1 will be mainly described in sequence. Matters not particularly referred to hereinbelow are the same as those in the above-mentioned first embodiment.

In the second embodiment, first, the transparent substrate preparation step (S21) is carried out in the same manner as the transparent substrate preparation step (S1) of the first embodiment to thereby prepare a transparent substrate 5. Then, the thin film forming step (S22) is carried out in the same manner as the thin film forming step (S5) of the first embodiment to thereby prepare a mask blank 14 having a pattern-formation thin film 11 formed on a main surface 1 of the transparent substrate 5 (the steps from the transparent substrate preparation step (S21) to the thin film forming step (S22) correspond to mask blank preparation steps). If necessary, the film stress control step (S23) is carried out in the same manner as the film stress control step (S6) of the first embodiment to thereby reduce the film stress of the pattern-formation thin film 11. The film stress of the pattern-formation thin film 11 is such that an absolute value of a change amount of the main surface 1 before and after the film formation should be controlled to at least 0.1 μm or less by TIR (total indicated reading) and is preferably less than 0.1 μm and more preferably 50 nm or less.

Then, with respect to the mask blank 14, the shape measurement step (S24) is carried out in the same manner as the shape measurement step (S2) of the first embodiment to thereby obtain a before-chucking main surface shape which is a main surface shape of a main surface of the mask blank 14 before it is placed on the mask stage. Herein, the before-chucking main surface shape of the mask blank 14 obtained by the flatness measuring apparatus is a surface shape of the pattern-formation thin film 11 formed on the main surface 1 of the transparent substrate 5. However, the distribution of the thickness of the pattern-formation thin film 11 formed by sputtering is quite uniform. Further, the film stress of the pattern-formation thin film 11 is controlled to be very low. Therefore, even if the surface shape of the pattern-formation thin film 11 is deemed to be equivalent to a before-chucking main surface shape of the main surface 1 of the transparent substrate 5, the simulation accuracy is not substantially affected.

Then, using the obtained before-chucking main surface shape of the mask blank 14, the simulation step (S25) is carried out in the same manner as the simulation step (S3) of the first embodiment to thereby obtain an after-chucking main surface shape of the mask blank 14. The deflection differential equation used in the simulation step (S25) is for the transparent substrate 5. However, the thickness of the transparent substrate 5 is about 6 mm while the thickness of the pattern-formation thin film 11 is 100 nm or less and, therefore, the influence upon the area moment of inertia and so on is very small. Further, the film stress of the pattern-formation thin film 11 is controlled to be very low. Therefore, even if the after-chucking main surface shape of the mask blank 14 is calculated through simulation based on the deflection differential equation for the transparent substrate 5, the simulation accuracy is not substantially affected. The after-chucking main surface shape of the mask blank 14 obtained herein can be deemed to be equivalent to an after-chucking main surface shape of the transparent substrate 5.

Then, using the obtained after-chucking main surface shape of the mask blank 14, the selection step (S26) is carried out in the same manner as the selection step (S4) of the first embodiment to thereby select the mask blank whose main surface flatness in a calculation region after chucking is a predetermined value or less. Herein, the mask blank not selected is sent to a recycling step (S27). In the recycling step (S27), the mask blank is classified as a mask blank adapted for producing a low-grade transfer mask, as a mask blank which is subjected to stripping of the pattern-formation thin film 11 and is again sent to the transparent substrate preparation step (S21), as a mask blank to be discarded, or as another, which will be processed accordingly. With respect to the mask blank selected as satisfying a specification in the selection step (S26), the resist film forming step (S28) is carried out in the same manner as the resist film forming step (S7) of the first embodiment to thereby form a resist film. The above-mentioned steps from the transparent substrate preparation step (S21) to the selection step (S26) or to the resist film forming step (S28) form the mask blank manufacturing method.

Subsequently, with respect to the mask blank having the resist film, the transfer mask manufacturing step (S29) is carried out in the same manner as the transfer mask manufacturing step (S8) of the first embodiment to thereby obtain a transfer mask (exposure mask). Further, using the obtained transfer mask and according to photolithography using ArF excimer laser light as exposure light, a transfer pattern of the transfer mask is transferred onto a resist film formed on a semiconductor substrate (semiconductor wafer) so as to form a required circuit pattern on the semiconductor substrate. In this manner, a semiconductor device is manufactured.

Example

Hereinbelow, transfer mask manufacturing steps including mask blank substrate manufacturing steps and mask blank manufacturing steps will be described in detail with reference to an Example.

(I) Transparent Substrate Preparation Step

Main surfaces of square transparent plates (synthetic quartz glass plates) were precision-polished and cleaned, thereby preparing 20 transparent substrates (about 152 mm×about 152 mm×6.35 mm).

(II) Shape Measurement Step

With respect to each of the 20 transparent substrates, using a flatness measuring apparatus (UltraFlat200M manufactured by Corning Tropel Corporation) utilizing an optical interferometer, information of a before-chucking main surface shape (height information from a focal plane (virtual absolute plane) calculated by the method of least squares) was obtained at 256×256 measurement points in an actual measurement region (148 mm×148 mm) on the main surface (the main surface where a pattern-formation thin film was going to be formed) of the transparent substrate and was correlated with the corresponding transparent substrate (a barcode attached to a substrate carrying case) and stored in a computer (recording apparatus). In order to suppress as much as possible deflection of the transparent substrate due to its self-weight, the before-chucking main surface shape was measured in the state where the transparent substrate was stood upright or substantially upright (free-standing state).

(III) Simulation Step

With respect to each transparent substrate, based on the information of the before-chucking main surface shape obtained in the shape measurement step and shape information of a mask stage of an exposure apparatus in regions (regions, each being about 10 mm×132 mm, from two opposite end faces of the transparent substrate, respectively) where the mask stage contacts the main surface of the transparent substrate, height information from the reference plane when the transparent substrate was set in the exposure apparatus (an after-chucking main surface shape) was calculated through simulation at the respective measurement points according to the above-mentioned deflection differential equation. The calculated height information (after-chucking main surface shape) was correlated with the corresponding transparent substrate and stored in the computer.

Figure 7:
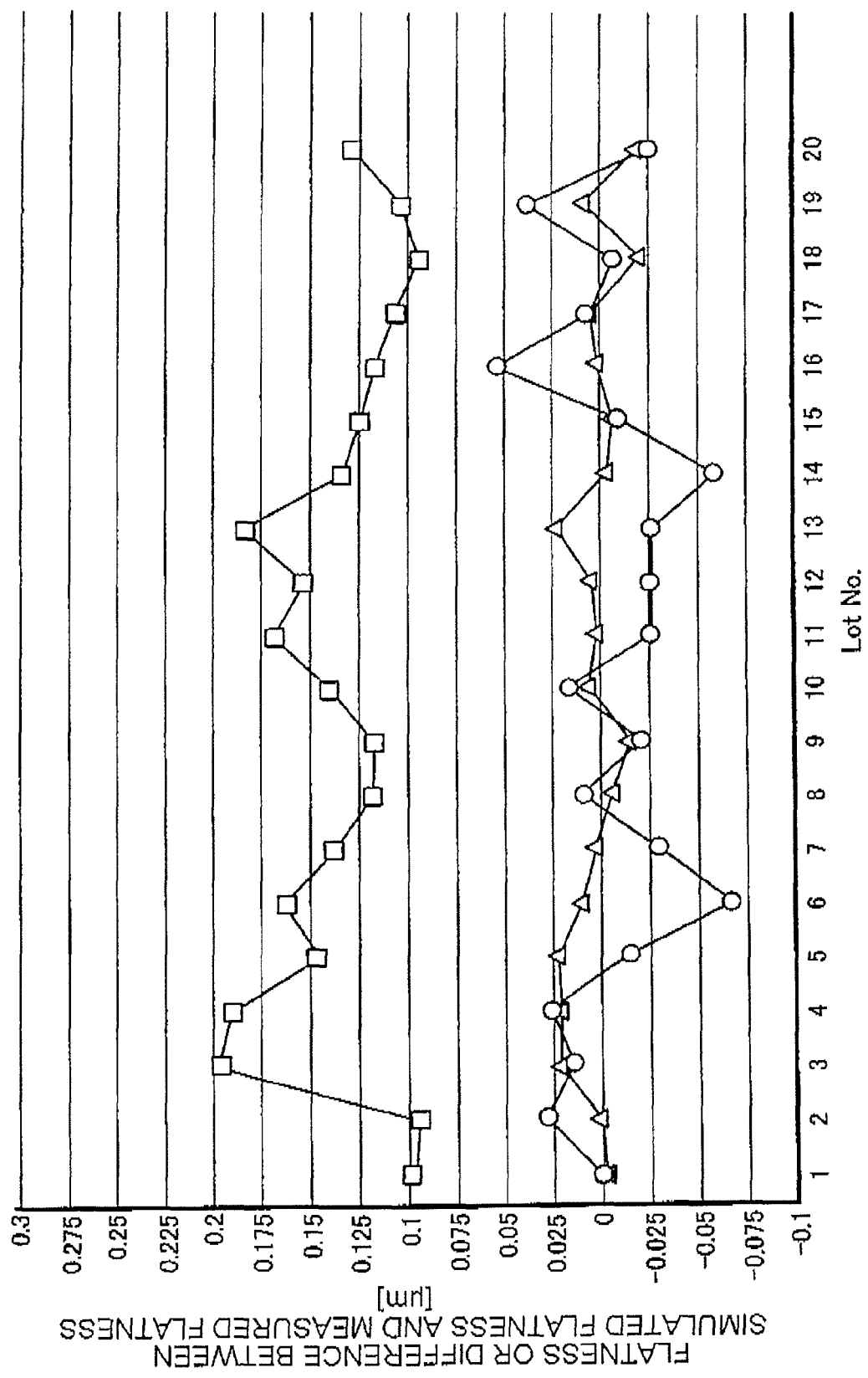
FIG. 7 is a diagram for explaining the accuracy of a simulation according to this invention.

Herein, in order to verify the accuracy of the simulation in this Example, the following were carried out. First, a simulation of an after-chucking main surface shape was carried out for each transparent substrate according to the conventional deflection differential equation (not taking into account a twist deformation amount). Then, each transparent substrate was actually vacuum-chucked on a stage having the same structure as the mask stage of the exposure apparatus to thereby measure an after-chucking main surface shape at the respective measurement points using the flatness measuring apparatus. Then, flatnesses were respectively calculated from the obtained after-chucking main surface shapes with respect to a region of 132 mm×104 mm. Then, differences between the flatnesses calculated from the after-chucking main surface shapes obtained through the simulation in this Example and the flatnesses calculated from the measured after-chucking main surface shapes and differences between the flatnesses calculated from the after-chucking main surface shapes obtained through the conventional simulation not taking into account the twist deformation amount and the flatnesses calculated from the measured after-chucking main surface shapes were respectively calculated and compared with each other. The results are shown in FIG. 7. In FIG. 7, the abscissa axis represents lot numbers of the 20 transparent substrates while the ordinate axis represents the flatness or the difference between the simulated flatness and the measured flatness.

In FIG. 7, □ represents a flatness calculated from the after-chucking main surface shape obtained through the simulation taking into account the twist deformation amount in this Example. On the other hand, Δ represents a difference between such a flatness calculated from the after-chucking main surface shape in this Example and a flatness calculated from the measured after-chucking main surface shape and ○ represents a difference between a flatness calculated from the after-chucking main surface shape obtained through the conventional simulation not taking into account the twist deformation amount and a flatness calculated from the measured after-chucking main surface shape. In the case of the simulation not taking into account the twist deformation amount, depending on the before-chucking main surface shape, the difference between the measured flatness after chucking and the calculated flatness through the simulation is somewhat large (±0.05 μm or more) in several transparent substrates as seen from ○ plots in FIG. 7. In contrast, as seen from Δ plots in FIG. 7, in the case of the simulation taking into account the twist deformation amount, the difference between the measured flatness after chucking and the calculated flatness through the simulation falls within 0.03 μm with respect to all the before-chucking main surface shapes and thus the estimation is accurately carried out.

Then, in order to verify the estimation accuracy in the simulation at the respective measurement points on the main surface, the following were carried out. First, differences in height information at the respective measurement points on the main surface with respect to the measured after-chucking main surface shape as a reference were each defined as a vector difference and vector differences were respectively calculated with respect to the after-chucking main surface shapes obtained through the simulation taking into account the twist deformation amount and the after-chucking main surface shapes obtained through the simulation not taking into account the twist deformation amount. Then, the largest absolute value among the calculated vector differences at the respective measurement points on the main surface is defined as a maximum vector difference and maximum vector differences were respectively obtained with respect to the after-chucking main surface shapes obtained through the simulation taking into account the twist deformation amount and the after-chucking main surface shapes obtained through the simulation not taking into account the twist deformation amount. The results are shown in FIG. 8.

Figure 8:
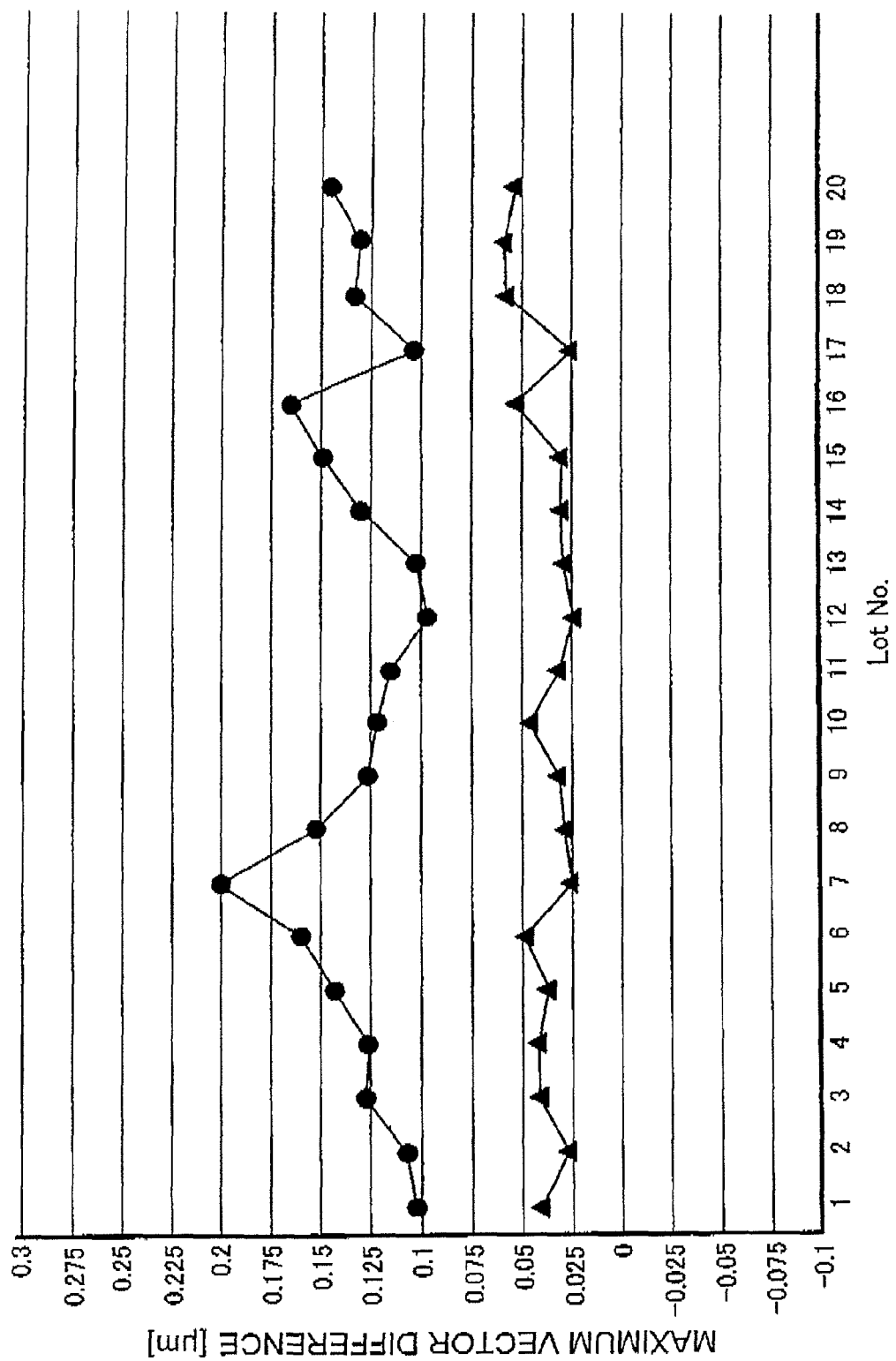
FIG. 8 is a diagram for explaining the accuracy of the simulation according to this invention.

In FIG. 8, ▲ represents a maximum vector difference between the after-chucking main surface shape obtained through the simulation taking into account the twist deformation amount in this Example and the measured after-chucking main surface shape and ● represents a maximum vector difference between the after-chucking main surface shape obtained through the conventional simulation not taking into account the twist deformation amount and the measured after-chucking main surface shape. In the case of the simulation not taking into account the twist deformation amount, as seen from ● plots, the maximum vector difference is 0.1 µm or more with respect to all the transparent substrates and thus it is difficult to say that the estimation of displacement amounts of the respective measurement points is sufficient. In contrast, in the case of the simulation taking into account the twist deformation amount, as seen from ▲ plots, the maximum vector difference falls within 0.06 µm with respect to all the transparent substrates and thus it can be said that the estimation of displacement amounts of the respective measurement points is accurately carried out.

Figure 9:
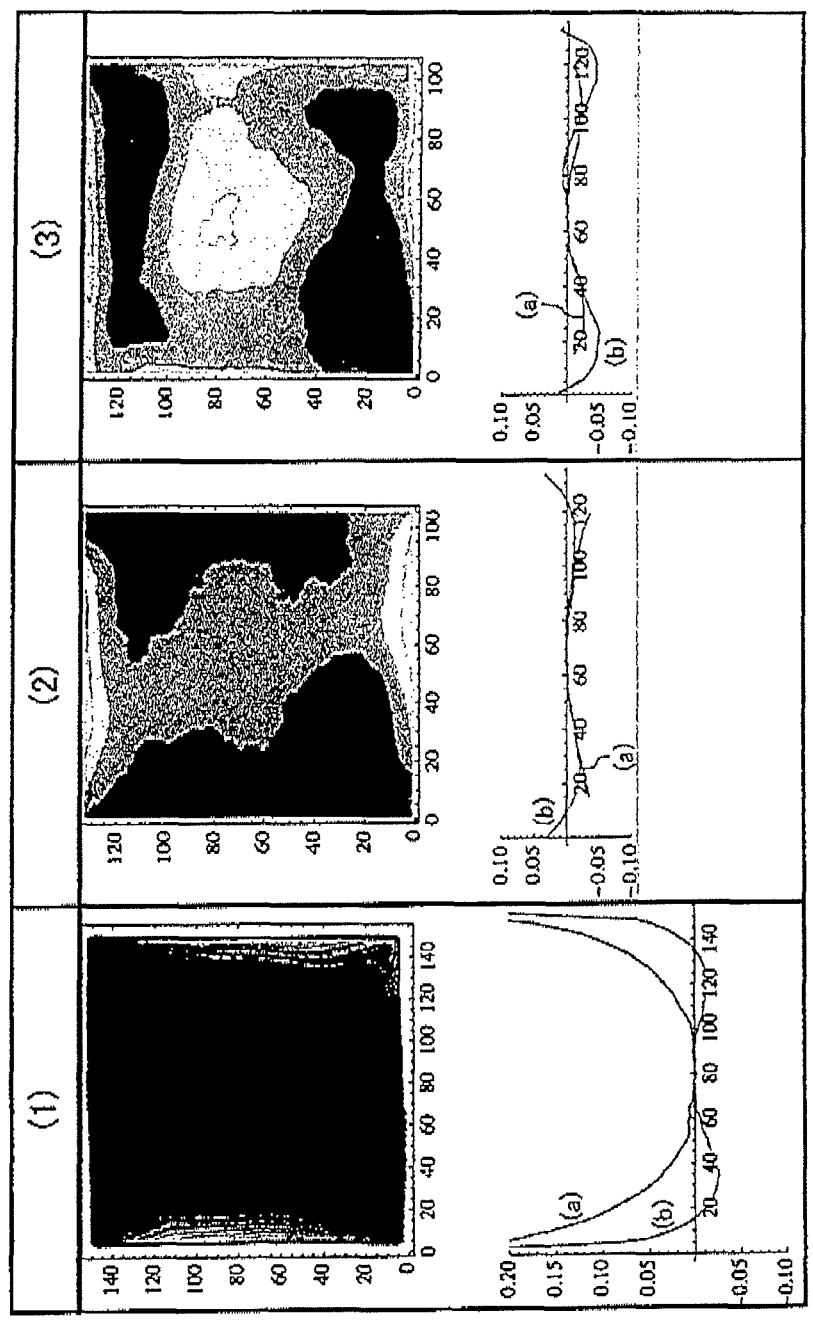
FIG. 9 is a diagram comparing the results of the simulation according to this invention and a conventional simulation.

FIG. 9 shows detailed results for one (Lot No. 1) of the transparent substrates subjected to the above-mentioned verification. In FIG. 9, (1) shows the before-chucking main surface shape actually measured in the free-standing state. An upper diagram of (1) is a contour diagram of the transparent substrate, wherein the abscissa axis extends in the X-direction while the ordinate axis extends in the Y-direction (longitudinal direction of the mask stage). A portion of the same depth represents a portion where the height is within 0.02 µm. In the contour diagram, a portion where lines are crowded represents a portion where the surface of the transparent substrate has a large change in height. Conversely, a portion where lines are not crowded represents a flat portion where the change in height is small. A lower graph of (1) is a center cross-sectional graph showing changes in height of the surface of the transparent substrate in directions along the X- and Y-directions passing through the center of the transparent substrate. The ordinate axis represents the height (µm) while the abscissa axis represents the position (mm) in the transparent substrate. In the graph, a line (a) represents the change in height in the X-direction while a line (b) represents the change in height in the Y-direction.

In FIG. 9, (2) shows a contour diagram and a center cross-sectional graph for the after-chucking main surface shape calculated through the simulation taking into account the twist deformation amount, while, (3) shows a contour diagram and a center cross-sectional graph for the after-chucking main surface shape calculated through the simulation not taking into account the twist deformation amount. With respect to the flatness in the region of 132 mm×104 mm, it is 0.144 µm in the before-chucking main surface shape, 0.100 µm in the measured after-chucking main surface shape, 0.097 µm in the after-chucking main surface shape calculated through the simulation taking into account the twist deformation amount, and 0.102 µm in the after-chucking main surface shape calculated through the simulation not taking into account the twist deformation amount. Therefore, the estimation is accurately carried out in both simulations. However, with respect to the maximum vector difference, it is 0.04 µm in the simulation taking into account the twist deformation amount while it is 0.1 µm or more in the simulation not taking into account the twist deformation amount. Therefore, a large difference occurs in the estimation accuracy. Comparison between the contour diagrams for both also makes it clear that there is a difference in the estimation results. From the results described above, it can be said that the simulation according to this Example is capable of carrying out the estimation with high accuracy, i.e. with only a small difference as compared with the actual measurement. Further, the time required for the simulation according to this Example has no large difference as compared with the time required for the conventional simulation not taking into account the twist deformation amount and, as a consequence, the throughput is quite excellent as compared with the simulation using the finite element method.

(IV) Selection Step

From the above-mentioned simulation results, with respect to each transparent substrate, a difference between maximum and minimum values from the reference plane was obtained in a calculation region (132 mm×132 mm) including a transfer region of a transfer mask. In this manner, a flatness in the calculation region was calculated for each transparent substrate. As a result, the transparent substrates having a flatness threshold value of 0.12 µm or less (132 mm×132 mm) were selected (16 transparent substrates were successful) and used as mask blank substrates.

(V) Thin Film Forming Step

With respect to each of the selected mask blank substrates, a light-shielding film (pattern-formation thin film) comprising a light-shielding layer and a front-surface antireflection layer was formed on the main surface.

The mask blank substrate was placed in a single-wafer DC magnetron sputtering apparatus. Using a mixed target of molybdenum (Mo) and silicon (Si) (at % ratio Mo:Si=21:79) as a sputtering target, a MoSiN film was formed in a mixed gas atmosphere of argon and nitrogen. Then, using a mixed target of molybdenum (Mo) and silicon (Si) (at % ratio Mo:Si=4:96) as a sputtering target, a MoSiON film was formed in a mixed gas atmosphere of argon, nitrogen, oxygen, and helium. In this manner, there was formed a light-shielding film made of MoSi-based materials and having a two-layer laminated structure comprising a light-shielding layer in the form of the MoSiN film (composition ratio Mo:14.7 at %, Si:56.2 at %, N:29.1 at %) having a thickness of 50 nm and a front-surface antireflection layer in the form of the MoSiON film (composition ratio Mo:2.6 at %, Si:57.1 at %, 0:15.9 at %, N:24.4 at %) having a thickness of 10 nm. The elements of the respective layers of the light-shielding film were analyzed by the Rutherford backscattering spectrometry. The optical density (OD) of the light-shielding film for the wavelength of ArF excimer laser exposure light was 3.0.

(VI) Film Stress Control Step

Each mask blank substrate formed with the light-shielding film was heat-treated (annealed) at 450° C. for 30 minutes to thereby reduce the film stress of the light-shielding film. In this manner, the film stress of the light-shielding film was made substantially zero.

(VII) Thin Film (Etching Mask Film) Forming Step

With respect to each mask blank substrate having the light-shielding film with the reduced film stress, an etching mask film (pattern-formation thin film) was formed on the light-shielding film.

The mask blank substrate was placed in a single-wafer DC magnetron sputtering apparatus. Using a chromium (Cr) target as a sputtering target, a CrOCN film as the etching mask film was formed to a thickness of 10 nm in a mixed gas atmosphere of argon, carbon dioxide, nitrogen, and helium.

(VIII) Film Stress Control Step

Each mask blank substrate formed with the etching mask film was heat-treated (annealed) at a temperature lower than that of the annealing of the light-shielding film to thereby reduce the film stress of the etching mask film. Then, predetermined cleaning was carried out. In this manner, mask blanks were manufactured.

(IX) Resist Film Forming Step

A resist (chemically amplified resist for electron beam writing exposure: PRL009 manufactured by FUJIFILM Electronic Materials Co., Ltd.) was spin-coated on the etching mask film of each of the manufactured mask blanks and then prebaked, thereby forming a resist film having a thickness of 100 nm. In this manner, resist-film-coated mask blanks were obtained.

(X) Transfer Mask (Set) Manufacturing Step

Using the double patterning technique, a single fine, high-density design pattern corresponding to the DRAM hp32 nm generation was divided into two relatively sparse design patterns. Two of the manufactured resist-film-coated mask blanks (hereinafter referred to as "mask blanks") were selected and design patterns to be formed in the respective light-shielding films were determined. The information about the before-chucking main surface shapes and the after-chucking main surface shapes of the selected mask blanks correlated with the mask blanks (transparent substrates) and stored in the server (computer) was downloaded. A displacement tendency of the light-shielding film of each mask blank following the change in main surface shape before and after chucking was calculated from the downloaded information. Based on this calculated displacement tendency, each design pattern was corrected. The resist film of the mask blank for which the corrected design pattern was determined earlier was subjected to exposure by electron beam writing and then subjected to predetermined development and cleaning, thereby forming a resist pattern having a transfer pattern.

Using the resist pattern as a mask, the etching mask film was dry-etched by a mixed gas of chlorine and oxygen to thereby transfer the transfer pattern to the etching mask film. Then, using the etching mask film as a mask, the light-shielding film was dry-etched to thereby transfer the transfer pattern to the light-shielding film. In this event, a mixed gas of $SF_6$ and He was used as an etching gas. Finally, the etching mask film was removed by dry etching using a mixed gas of chlorine and oxygen and then predetermined cleaning was carried out, Successively, the other mask blank was processed in the same manner. As a result, two transfer masks (set) for double patterning were manufactured.

(XI) Semiconductor Device Manufacturing Step

Using the manufactured two transfer masks (set), a semiconductor device was manufactured according to the double patterning technique (double exposure technique). The first transfer mask was set (vacuum-chucked) on a mask stage of an exposure apparatus and a first transfer pattern was exposed and transferred onto a resist film on a semiconductor substrate using ArF exposure light. Subsequently, the second transfer mask was set (vacuum-chucked) on the mask stage of the exposure apparatus and a second transfer pattern was exposed and transferred onto the resist film on the semiconductor substrate using ArF exposure light. As a result, a single fine, high-density transfer pattern corresponding to the DRAM hp32 nm generation was exposed and transferred onto the resist film on the semiconductor substrate. Predetermined development was applied to the resist film on the semiconductor substrate to form a resist pattern. Then, using the resist pattern as a mask, a circuit pattern was transferred to an underlying thin film by dry etching. The transferred circuit pattern was inspected. As a result, it was confirmed that the circuit pattern was accurately transferred without any shorted or disconnected portion. That is, it was proved that there was formed the transfer pattern adapted to the change in main surface shape when the transfer mask was chucked on the mask stage, and thus that the accuracy of the simulation for the transparent substrate was sufficiently high. Using other transfer mask sets manufactured in the same manner as described above, a laminated structure of circuit patterns was formed on the semiconductor substrate. In this manner, a semiconductor device was manufactured. The obtained semiconductor device was inspected. As a result, it was confirmed that the semiconductor device operated normally.

While the embodiment of this invention has been described with reference to the drawings, it is needless to say that this invention is not limited thereto. For example, even if the transparent substrate has a size other than that of about 152 mm×about 152 mm×6.35 mm, the same effect as that of the embodiment can be obtained. It is apparent that a person skilled in the art can think of various changes and modifications in the category of the technical idea described in claims and it is understood that those also naturally belong to the technical scope of this invention.

What is claimed is:

1. A method of manufacturing a mask blank substrate, comprising:

a step of preparing a transparent substrate having a precision-polished main surface;

a shape measurement step of measuring a before-chucking main surface shape in a measurement region of the main surface;

a simulation step of obtaining, through simulation, an after-chucking main surface shape of a condition where the transparent substrate is chucked on a mask stage of an exposure apparatus; and a selection step of selecting, as a mask blank substrate, the transparent substrate whose flatness in a calculation region is a predetermined value or less, the flatness being obtained from the after-chucking main surface shape, wherein the simulation step comprises calculating the after-chucking main surface shape by simulation using a deflection differential equation in mechanics of materials, the deflection differential equation represents that height information in the after-chucking main surface shape is obtained by adding at least gravity deformation amount, lever deformation amount, warp deformation amount, and twist deformation amount to height information in the before-chucking main surface shape, the gravity deformation amount is a deformation amount of the main surface caused by a gravity of the transparent substrate when the transparent substrate is set on a mask stage, the lever deformation amount is a deformation amount of the main surface caused by lever deformation of the main surface with respect to the mask stage when the transparent substrate is chucked on the mask stage, the warp deformation amount is a deformation amount of the main surface caused by that the main surface is warped along a shape of the mask stage, and the twist deformation amount is a deformation amount of the main surface caused by a deformation correcting a twist of the main surface.

2. The method according to claim 1, wherein the shape measurement step comprises a step of correlating information of the before-chucking main surface shape with the measured transparent substrate and storing in a recording apparatus, and the simulation step comprises a step of correlating information of the after-chucking main surface shape with the transparent substrate subjected to the simulation and storing in the recording apparatus.

3. The method according to claim 1, wherein the measurement region is a region including a region where the transparent substrate is chucked by the mask stage of the exposure apparatus.

4. The method according to claim 3, wherein the measurement region is a region excluding a peripheral region of more than 0 mm and 3 mm or less from a chamfered surface of the transparent substrate.

5. The method according to claim 1, wherein the calculation region is a 132 mm square region with respect to a center of the transparent substrate.

6. The method according to claim 1, wherein the predetermined value of the flatness is 0.24 μm.

7. The method according to claim 1, further comprising a step of selecting the transparent substrate whose flatness in a predetermined region obtained from the before-chucking main surface shape is 0.4 μm or less.

8. A method of manufacturing a mask blank, comprising a thin film forming step of forming a pattern-formation thin film on the main surface of the mask blank substrate manufactured by the method according to claim 1.

9. A method of manufacturing a transfer mask, comprising a step of forming a transfer pattern in the pattern-formation thin film of the mask blank manufactured by the method according to claim 8.

10. A method of manufacturing a semiconductor device, comprising forming a circuit pattern on a semiconductor wafer using the transfer mask manufactured by the method according to claim 9.

11. A method of manufacturing a mask blank substrate, comprising:

a step of preparing a transparent substrate having a precision-polished main surface; a shape measurement step of measuring a before-chucking main surface shape in a measurement region of the main surface and correlating information of the before-chucking main surface shape with the measured transparent substrate and storing in a recording apparatus; and a simulation step of obtaining, through simulation, an after-chucking main surface shape of a condition where the transparent substrate is chucked on a mask stage of an exposure apparatus;

wherein the simulation step comprises:

calculating the after-chucking main surface shape by simulation using a deflection differential equation in mechanics of materials, and recording information of the after-chucking main surface shape after the simulation in a recording apparatus with being correlated with the transparent substrate, the deflection differential equation represents that height information in the after-chucking main surface shape is obtained by adding at least gravity deformation amount, lever deformation amount, warp deformation amount, and twist deformation amount to height information in the before-chucking main surface shape, the gravity deformation amount is a deformation amount of the main surface caused by a gravity of the transparent substrate when the transparent substrate is set on a mask stage, the lever deformation amount is a deformation amount of the main surface caused by lever deformation of the main surface with respect to the mask stage when the transparent substrate is chucked on the mask stage, the warp deformation amount is a deformation amount of the main surface caused by that the main surface is warped along a shape of the mask stage, and the twist deformation amount is a deformation amount of the main surface caused by a deformation correcting a twist of the main surface.

12. The method according to claim 11, wherein the measurement region is a region including a region where the transparent substrate is chucked by the mask stage of the exposure apparatus.

13. The method according to claim 12, wherein the measurement region is a region excluding a peripheral region of more than 0 mm and 3 mm or less from a chamfered surface of the transparent substrate.

14. The method according to claim 11, further comprising a step of selecting the transparent substrate whose flatness in a predetermined region obtained from the before-chucking main surface shape is 0.4 μm or less.

15. A method of manufacturing a mask blank, comprising a thin film forming step of forming a pattern-formation thin film on the main surface of the mask blank substrate manufactured by the method according to claim 11.

16. A method of manufacturing a transfer mask, comprising a step of forming a transfer pattern in the pattern-formation thin film of the mask blank manufactured by the method according to claim 15.

17. A method of manufacturing a semiconductor device, comprising forming a circuit pattern on a semiconductor wafer using the transfer mask manufactured by the method according to claim 16.

18. A method of manufacturing a mask blank, comprising:

a step of preparing a mask blank having a pattern-formation thin film on a main surface of a transparent substrate;

a shape measurement step of measuring a before-chucking main surface shape in a measurement region of a main surface of the mask blank;

a simulation step of obtaining, through simulation, an after-chucking main surface shape of a condition where the mask blank is chucked on a mask stage of an exposure apparatus; and a selection step of selecting the mask blank whose flatness in a calculation region is a predetermined value or less, the flatness being obtained from the after-chucking main surface shape, wherein the simulation step comprises calculating the after-chucking main surface shape by simulation using a deflection differential equation in mechanics of materials, the deflection differential equation represents that height information in the after-chucking main surface shape is obtained by adding at least gravity deformation amount, lever deformation amount, warp deformation amount, and twist deformation amount to height information in the before-chucking main surface shape, the gravity deformation amount is a deformation amount of the main surface caused by a gravity of the transparent substrate when the transparent substrate is set on a mask stage, the lever deformation amount is a deformation amount of the main surface caused by lever deformation of the main surface with respect to the mask stage when the transparent substrate is chucked on the mask stage, the warp deformation amount is a deformation amount of the main surface caused by that the main surface is warped along a shape of the mask stage, and the twist deformation amount is a deformation amount of the main surface caused by a deformation correcting a twist of the main surface.

19. The method according to claim 18, wherein the shape measurement step comprises a step of correlating information of the before-chucking main surface shape with the measured mask blank and storing in a recording apparatus, and the simulation step comprises a step of correlating information of the after-chucking main surface shape with the mask blank subjected to the simulation and storing in the recording apparatus.

20. The method according to claim 18, wherein the measurement region is a region including a region where the mask blank is chucked by the mask stage of the exposure apparatus.

21. The method according to claim 20, wherein the measurement region is a region excluding a peripheral region of more than 0 mm and 3 mm or less from a chamfered surface of the transparent substrate.

22. The method according to claim 18, wherein the calculation region is a 132 mm square region with respect to a center of the mask blank.

23. The method according to claim 18, wherein the predetermined value of the flatness is 0.24 µm.

24. The method according to claim 18, further comprising a step of selecting the mask blank whose flatness in a predetermined region obtained from the before-chucking main surface shape is 0.4 µm or less.

25. A method of manufacturing a transfer mask, comprising a step of forming a transfer pattern in the pattern-formation thin film of the mask blank manufactured by the method according to claim 18.

26. A method of manufacturing a semiconductor device, comprising forming a circuit pattern on a semiconductor wafer using the transfer mask manufactured by the method according to claim 25.

27. A method of manufacturing a mask blank, comprising:
a step of preparing a mask blank having a pattern-formation thin film on a main surface of a transparent substrate;
a shape measurement step of measuring a before-chucking main surface shape in a measurement region of a main surface of the mask blank and correlating information of the before-chucking main surface shape with the measured mask blank and storing in a recording apparatus; and
a simulation step of obtaining, through simulation, an after-chucking main surface shape of a condition where the mask blank is chucked on a mask stage of an exposure apparatus;
wherein the simulation step comprises:
calculating the after-chucking main surface shape by simulation using a deflection differential equation in mechanics of materials, and
recording information of the after-chucking main surface shape after the simulation in a recording apparatus with being correlated with the transparent substrate,
the deflection differential equation represents that height information in the after-chucking main surface shape is obtained by adding at least gravity deformation amount, lever deformation amount, warp deformation amount, and twist deformation amount to height information in the before-chucking main surface shape, the gravity deformation amount is a deformation amount of the main surface caused by a gravity of the transparent substrate when the transparent substrate is set on a mask stage, the lever deformation amount is a deformation amount of the main surface caused by lever deformation of the main surface with respect to the mask stage when the transparent substrate is chucked on the mask stage, the warp deformation amount is a deformation amount of the main surface caused by that the main surface is warped along a shape of the mask stage, and the twist deformation amount is a deformation amount of the main surface caused by a deformation correcting a twist of the main surface.

28. The method according to claim 27, wherein the measurement region is a region including a region where the mask blank is chucked by the mask stage of the exposure apparatus.

29. The method according to claim 28, wherein the measurement region is a region excluding a peripheral region of more than 0 mm and 3 mm or less from a chamfered surface of the transparent substrate.

30. The method according to claim 27, further comprising a step of selecting the mask blank whose flatness in a predetermined region obtained from the before-chucking main surface shape is 0.4 µm or less.

31. A method of manufacturing a transfer mask, comprising a step of forming a transfer pattern in the pattern-formation thin film of the mask blank manufactured by the method according to claim 27.

32. A method of manufacturing a semiconductor device, comprising forming a circuit pattern on a semiconductor wafer using the transfer mask manufactured by the method according to claim 31.

33. A method of manufacturing a transfer mask, comprising:
a step of preparing a mask blank having a pattern-formation thin film on a main surface of a transparent substrate;
a shape measurement step of measuring a before-chucking main surface shape in a measurement region of a main surface of the mask blank;
a simulation step of obtaining, through simulation, an after-chucking main surface shape of a condition where the mask blank is chucked on a mask stage of an exposure apparatus;
a selection step of selecting the mask blank whose flatness in a calculation region is a predetermined value or less, the flatness being obtained from the after-chucking main surface shape; and
a step of forming a transfer pattern in the pattern-formation thin film of the mask blank selected in the selection step,
wherein the simulation step comprises calculating the after-chucking main surface shape by simulation using a deflection differential equation in mechanics of materials,
the deflection differential equation represents that height information in the after-chucking main surface shape is obtained by adding at least gravity deformation amount, lever deformation amount, warp deformation amount, and twist deformation amount to height information in the before-chucking main surface shape,
the gravity deformation amount is a deformation amount of the main surface caused by a gravity of the transparent substrate when the transparent substrate is set on a mask stage,
the lever deformation amount is a deformation amount of the main surface caused by lever deformation of the main surface with respect to the mask stage when the transparent substrate is chucked on the mask stage, the warp deformation amount is a deformation amount of the main surface caused by that the main surface is warped along a shape of the mask stage, and the twist deformation amount is a deformation amount of the main surface caused by a deformation correcting a twist of the main surface.

34. The method according to claim 33, wherein the shape measurement step comprises a step of correlating information of the before-chucking main surface shape with the measured mask blank and storing in a recording apparatus, and the simulation step comprises a step of correlating information of the after-chucking main surface shape with the mask blank subjected to the simulation and storing in the recording apparatus.

35. The method according to claim 33, wherein the measurement region is a region including a region where the mask blank is chucked by the mask stage of the exposure apparatus.

36. The method according to claim 35, wherein the measurement region is a region excluding a peripheral region of more than 0 mm and 3 mm or less from a chamfered surface of the transparent substrate.

37. The method according to claim 33, wherein the calculation region is a 132 mm square region with respect to a center of the mask blank.

38. The method according to claim 33, wherein the predetermined value of the flatness is 0.24 μm.

39. The method according to claim 33, further comprising a step of selecting the mask blank whose flatness in a predetermined region obtained from the before-chucking main surface shape is 0.4 μm or less.

40. A method of manufacturing a semiconductor device, comprising forming a circuit pattern on a semiconductor wafer using the transfer mask manufactured by the method according to claim 33.

* * * * *